(12) United States Patent
Nakata

(10) Patent No.: US 8,237,045 B2
(45) Date of Patent: Aug. 7, 2012

(54) LAMINATED SOLAR BATTERY

(75) Inventor: Josuke Nakata, Kyoto (JP)

(73) Assignee: Kyosemi Corporation, Kyoto (JP)

( * ) Notice: Subject to any disclaimer, the term of this patent is extended or adjusted under 35 U.S.C. 154(b) by 977 days.

(21) Appl. No.: 10/588,668

(22) PCT Filed: Mar. 12, 2004

(86) PCT No.: PCT/JP2004/003360
§ 371 (c)(1),
(2), (4) Date: Aug. 30, 2006

(87) PCT Pub. No.: WO2005/088733
PCT Pub. Date: Sep. 22, 2005

(65) Prior Publication Data
US 2007/0169804 A1    Jul. 26, 2007

(51) Int. Cl.
*H02N 6/00* (2006.01)
*H01L 31/042* (2006.01)

(52) U.S. Cl. .................................................. 136/250

(58) Field of Classification Search .................. None
See application file for complete search history.

(56) References Cited

U.S. PATENT DOCUMENTS

| | | | | |
|---|---|---|---|---|
| 4,773,944 A * | 9/1988 | Nath et al. | | 136/249 |
| 5,009,719 A | 4/1991 | Yoshida | | |
| 5,720,827 A | 2/1998 | Simmons | | |
| 6,150,604 A * | 11/2000 | Freundlich et al. | | 136/253 |
| 6,204,545 B1 * | 3/2001 | Nakata | | 257/459 |
| 6,531,405 B1 * | 3/2003 | Wegleiter et al. | | 438/745 |
| 2002/0096206 A1 | 7/2002 | Hamakawa et al. | | |
| 2002/0109957 A1 | 8/2002 | Asai et al. | | |
| 2003/0226498 A1 * | 12/2003 | Alivisatos et al. | | 117/84 |
| 2006/0086384 A1 * | 4/2006 | Nakata | | 136/250 |

FOREIGN PATENT DOCUMENTS

| | | |
|---|---|---|
| JP | 2-218174 | 8/1990 |
| JP | 9-260698 | 10/1997 |
| JP | 2001-102618 | 4/2001 |
| JP | 2001-156315 | 6/2001 |
| JP | 2001-168369 | 6/2001 |
| JP | 3231244 | 9/2001 |
| JP | 3262174 | 12/2001 |
| JP | 3287579 | 3/2002 |
| JP | 2002-164554 | 6/2002 |
| JP | 2002-280592 | 9/2002 |
| WO | WO-98/15983 | 4/1998 |
| WO | WO-2004/001858 | 12/2003 |

OTHER PUBLICATIONS

Murayama et al., "Light trapping in spherical silicon solar cell module", Solar Energy Material & Solar Cells, vol. 79, (2003), pp. 113 to 124.
A.W. Bett et al., "III-V compound for solar cell applications", Applied Physics A, vol. 69 (1999), pp. 119 to 129.
N. S. Alvi et al., "The Potential for Increasing the Efficiency of Photovoltaic Systems Using Multiple Cell Concepts", Conference Record of 12th IEEE Photovoltaic Specialists Conference, 1976, pp. 948 to 956.

* cited by examiner

*Primary Examiner* — Jonathan Johnson
*Assistant Examiner* — Shannon Gardner
(74) *Attorney, Agent, or Firm* — Jordan and Hamburg LLP

(57) ABSTRACT

A laminated solar battery (200) wherein four solar cell modules are incorporated and integrally laminated is provided with four types of solar cell modules (90, 100, 70 and 60) which have different sensitivity wavelength bands and are so laminated that the shorter the center wavelength in the sensitivity wavelength band is, the more near the module is located to the incidental side of sunlight, wherein each of the three types solar cell modules (90, 100 and 70) is constituted with cell group modules having plural nearly spherical solar cells (30, 40 and 10) aligned in plural columns and plural rows and the lowest solar cell module (60) is constituted with a planar light receiving module.

11 Claims, 13 Drawing Sheets

LAMINATED SOLAR BATTERY

TECHNICAL FIELD

The present invention relates to a laminated solar battery, obtained by laminating two or more types of solar cell modules having different sensitivity wavelength bands and incorporates one or more cell group modules with plural spherical solar cells as at least one type of solar cell module, in order to effectively utilize a wide range of wavelength components in sunlight spectrum.

BACKGROUND OF THE RELATED ART

The sunlight spectrum has, on the earth, a broad wavelength band from ultraviolet rays to far infrared rays having a peak wavelength of approximately 600 nm. In order to receive such sunlight and convert it to electric energy with solar cells depending on a single energy band gap, the usable spectral range is limited and there is a limitation in terms of high efficiency photo-electric conversion. Therefore, in order to absorb a wide range sunlight spectrum, a solar battery of a photo-electric conversion structure has been proposed in which the sunlight spectrum is divided into plural sensitivity wavelength bands, and plural types of solar cell modules (or element solar cells, or solar cell layers) capable of accomplishing photo-electric conversion with high efficiency for each sensitivity wavelength band are laminated sequentially in the order of short central wavelength (large band gap) in sensitivity wavelength bands from the incidental side of sunlight.

Conventional solar batteries that have been proposed so far include the following.

(a) A solar battery in which the sunlight is divided into multiple wavelength bands through optical filter mirrors, and multiple types of independent solar cell modules suitable to respective sensitivity wavelength bands are arranged on sunlight paths, as described in N. S. Alvi, C. E. Bakus and G. W. Madesen, "Potential For Increasing the Efficiency of Photovoltaic Systems by Using Multiples Cell Concept", Conf. Proc. 12th IEEE Photovoltaic Specialist Conference 957 (1976).

(b) A solar battery in which multiple semiconductor layers having different energy band gaps are made by sequential crystal growth on a common substrate to integrally laminate a two-layer solar cell layer.

(c) A solar battery in which multiple types of solar cell panels are individually prepared by using semiconductors of different sensitivity wavelength bands and are arranged on the optical path of sunlight.

Solar batteries of above (b) and (c) are described in A. W. Bett, F. Dimroth, G. Stollwerck, O. V. Sulima "III-V Compounds For Solar Cell Applications" *Appl. Phys.* A69, 119-129 (1999).

In solar batteries of above (a) to (c), a pn junction is prepared in a planar semiconductor wafer or a semiconductor layer for element solar cells constituting a laminated solar battery. The solar battery of above (a) is not free from the degradation due to the optical loss of filter-mirrors and expensive manufacturing cost. The space among multiple element solar cells is large and requires a great deal of labor in their alignment and fixation, etc.

In the solar battery of above (b), the type of semiconductors that can be crystallized and grown on one substrate is restricted due to differences of crystal structure and lattice constant, making difficult the formation of pn junctions of different band gaps and a desirable shapes. In addition, tunnel junctions are necessary so that an electric current flow between laminated solar cell layers, but the resistance of the tunnel junctions is high. Moreover, the magnitude of the photo-electric current of laminated multiple solar cell layers become uneven, with the problem that the output current of the entire solar battery is restricted by a solar cell layer having the lowest magnitude of photo-electric current.

In the solar battery of above (c), the restriction of crystal growth such as the solar cell of above (b) is eliminated, but a window which allows light of a wavelength band not absorbed by the element solar cells is necessary for the element solar cells on the incidental side of sunlight. If the number of lamination and light-receiving areas of element solar cells is increased, there are drawbacks such as the fact that the effective light-receiving area is easily decreased due to an area increase of a comb-like electrode section and positional deviation of element solar cells. As with the solar battery of above (b), since solar cells consisting of a single pn junction are laminated, the problem remains that the magnitude of output current of element solar cells is uneven, and the output of the entire solar battery is restricted by an element solar cell having a small output current.

An objective of the present invention is to eliminate above described problems and to provide a laminated solar battery capable of improving remarkably the photo-electric conversion efficiency of sunlight.

SUMMARY OF THE INVENTION

The laminated solar battery wherein plural solar cell modules are incorporated and integrally laminated is characterized by that there are provided with plural types of solar cell modules having different sensitivity wavelength bands which are so laminated that the shorter the center wavelength in the sensitivity wavelength band is, the more near the module is located to the incidental side of sunlight, wherein at least one type of solar cell modules is constructed to be a cell group module having plural nearly spherical solar cells aligned in plural columns and plural rows. The laminated solar battery has plural types of solar cell modules having different sensitivity wavelength bands, and can generate electricity by utilizing sunlight of a wide wavelength range in the sunlight spectrum. The shorter the wavelength of light is, the weaker the transmission becomes, therefore the photo-electric conversion efficiency of the solar cell modules can be enhanced by laminating so that the shorter the center wavelength in the sensitivity wavelength band is, the more near the module is located to the incidental sunlight side as described above.

In the cell group modules incorporated with plural nearly spherical solar cells, the output current can be easily changed by changing the number of series connections and the number of parallel connections in a circuit where plural solar cells are electrically connected in series and in parallel. Therefore, the output current of plural types of solar cell modules are easily made uniform by changing the output current of at least one cell group module, favorable in enhancing the photo-electric conversion efficiency of the solar battery.

The solar cells in a cell group module have nearly spherical pn junctions, enabling an increase of the total area of nearly spherical pn junctions in the cell group module and enhancing the photo-electric conversion efficiency by making the arrangement of plural solar cells dense. Moreover, the solar cell in cell group module has nearly spherical pn junction favorable in enhancing photo-electric conversion efficiency since incidental light entering the solar cell has an opportunity to meet the pn junctions twice. Furthermore, each solar cell can be constructed to adopt a light confinement effect, favorable in enhancing photo-electric conversion efficiency. It is also possible that light reflected by the spherical surface changes its optical path and enters another solar cell, improving the overall light absorptivity. The solar cells of each cell group module can be independently prepared without being affected by the lattice constant, etc. of semiconductors constructing the pn junctions of other solar cell modules.

DETAILED DESCRIPTION OF THE PREFERRED EMBODIMENTS

Figure 1:
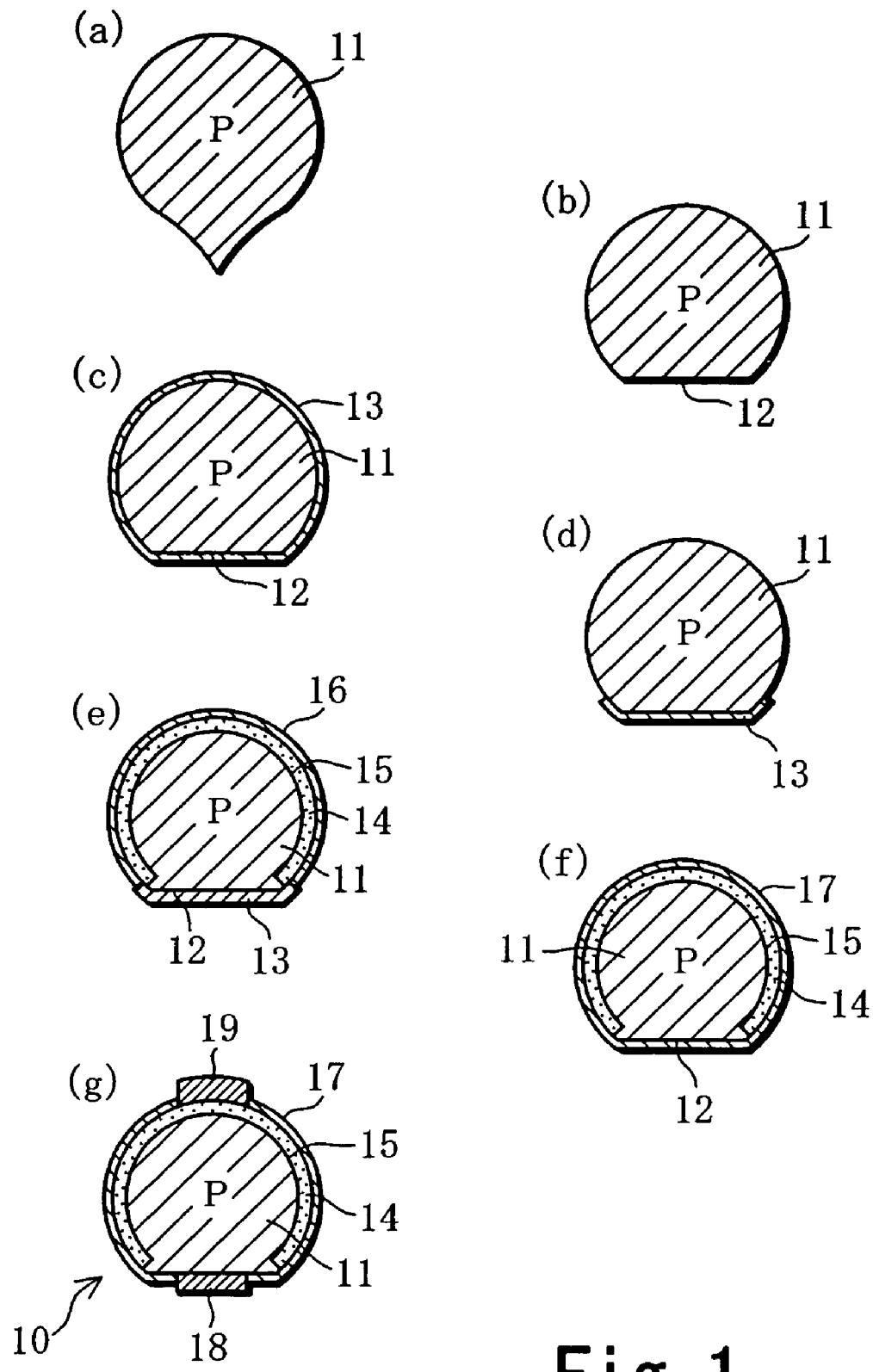
FIG. 1(a)~(g) are sectional views of Si single crystal, etc. in multiple processes for manufacturing spherical Si solar cells.

First, four types of nearly spherical solar cells which function as element cells for applying for the laminated solar battery of present invention are described; next, cell group modules incorporated with the spherical solar cells are described; then a planar light receiving module are described; subsequently a solar battery constituted by incorporating multiple cell group modules and one planar light receiving module are described. Afterwards, a cylindrical solar battery is obtained by laminating multiple cylindrical cell group modules in the shape of concentric cylinders.

The spherical solar cell is same as that already proposed by the inventor in Japanese Patent No. 3262174. When the solar cell is prepared, a spherical semiconductor crystal is prepared, a nearly spherical pn junction is formed in the surface resin of the semiconductor crystal, positive/negative electrodes are provided in opposite surface positions by interposing the center of the semi-conductor crystal there between, and the positive/negative electrodes are electrically connected to both poles of the pn junction.

The solar cell almost has no directivity with regard to the incidental direction of sunlight, therefore it shows excellent light receiving ability even if the incident angle of direct sunlight changes and also shows excellent light receiving ability for circumferential reflected light. It has strong points such as that the incident light is easily confined to the solar cell and photo-electrically converted effectively by the spherical pn junction.

When the spherical solar cell is manufactured, it is desirable that a spherical semiconductor crystal close to the size of a solar cell is used to reduce the loss of semiconductor materials. As a method of manufacturing the spherical semiconductor crystals, for example, a method proposed by the inventor in Japanese Patent No. 3231244 can be applied. Namely, liquid drops of a semiconductor in molten state freely fall from the top of a dropping tube, the spherical drops are super-cooled during free fall and solidified by providing stimulus from the outside to make a spherical or granular single crystal.

When a compound semiconductor containing elements of high vapor pressure is adopted, for example, it is possible to apply a method proposed by the inventor in Japanese Patent No. 3287579. According to this method, a spherical or granular single crystal is prepared by storing a raw material of a compound semiconductor and high vapor pressure elements among elements included in it with an atmosphere gas in a closed ampule and allowing the ampule to fall from the top of a dropping tube and solidifying the semiconductor raw material in the molten state during the described free fall. However, a spherical or granular single crystal can also be prepared by cutting out a cube close to the volume of a solar cell from a large single crystal and processing the cube in the shape of true sphere by mechano-chemical means. Spherical or nearly spherical solar cells are prepared using these spherical single crystals, and a solar cell module (i.e., cell group module) having specific sensitivity wavelength bands for the sunlight is prepared by using a large number of solar cells. In a spectral division-type solar battery (i.e., laminated solar battery), two or more types of solar cell modules having different sensitivity wavelength bands are combined and made into the laminated solar battery, and a planar pn junction light receiving module (i.e., planar light receiving module) sometimes is also combined and made into the laminated solar battery as necessary.

First, the structure and preparation of multiple types of solar cells (element solar cells) incorporated into the laminated solar battery of present invention are described. Since the solar cells mentioned here can be manufactured by the described well-known techniques or other well-known techniques, they are simply described. FIG. 1(a)~(g) show manufacturing processes in the case of manufacturing a nearly spherical silicon (Si) solar cell 10 comprising a Si solar cell to be incorporated into a solar cell module having sensitivity wavelength bands of a medium wavelength region (about 500~1,100 nm) in the sunlight spectrum and is prepared with a nearly spherical Si single crystal 11. Si is an indirect transition type semiconductor having an energy band gap of 1.12 eV.

When a granular p-type silicon single crystal 11 shown in FIG. 1(a) is prepared, a given amount of Si liquid drop is allowed to freely fall from the top of a dropping tube, where an inert gas is allowed to flow, and is made spherical due to surface tension while falling and is rapidly solidified from a super-cooled state while falling by adding a physical stimulus, such as a contact with one point of liquid drop, etc. to make a p-type silicon single crystal of about 1.2 mm in dia-meter.

A projection of the p-type silicon single crystal 11 is formed in the final stage of solidification. The projection is cut into a flat surface as shown in FIG. 1(b) and is used as a reference surface 12, which is about 0.3~0.5 mm in diameter. The reference surface 12 is used for alignment in succeeding processes of impurity diffusion, electrode formation, output characteristic measurement, wiring, etc. Next, as shown in FIG. 1(c), a silicon oxide film 13 is formed on the entire surface. Next, as shown in FIG. 1(d), the silicon oxide film 13 remains as a diffusion mask on the reference surface 12 and in the vicinity of its periphery, and the silicon oxide film 13 other than that portion is removed. Then, as shown in FIG. 1(e), an n-type diffusion layer 14 is formed by heating the silicon single crystal 11 of FIG. 1(d) and diffusing phosphorus (P) or arsenic (As) as an n-type impurity, and a nearly spherical pn junction 15 is formed between the p-type silicon single crystal 11 and the n-type diffusion layer 14. A thin Si oxide film 16 is also formed during the diffusion of the n-type impurity. The surface of p-type silicon single crystal 11 remains without being covered by the diffusion layer 14 on and in the vicinity of the reference surface 12. Next, as shown in FIG. 1(f), once the silicon oxide films 13, 16 are removed by etching, a thin anti-reflective film 17 consisting of an Si oxide film is once again formed on the entire surface. Then, as shown in FIG. 1(g), a silver-containing paste is coated in dots at the center of reference surface 12 facing the p-type silicon single crystal 11 and at the center of surface of the n-type diffusion layer 14 and then burned, silver passing through the thin Si oxide film 17 (anti-reflective film) to provide a positive electrode 18 and a negative electrode 19 in ohmic contact with the p-type silicon single crystal 11 and the surface of n-type diffusion layer 14, respectively. The electrodes 18, 19 are placed in opposite positions with interposing the center of Si single crystal 11, thereby the symmetry of distribution of light input and photo-electromotive force is maintained, the bias of current distribution is small, and a pn junction 15 functions with good efficiency.

Figure 2:
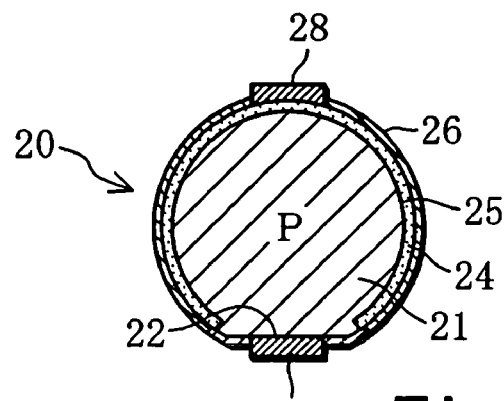
FIG. 2 is a sectional view of a spherical Ge solar cell.

FIG. 2 shows a Ge solar cell to be incorporated into a solar cell module having sensitivity wavelength bands of a long-wavelength region (about 800~1,600 nm) in the sunlight spectrum, and is a sectional view of a Ge solar cell 20 made of a nearly spherical germanium (Ge) single crystal. Germanium is an indirect transition-type semiconductor having an energy band gap of 0.66 eV, and the Ge solar cell 20 can be manufactured by almost same processes as the Si solar cell 10.

FIG. 2 shows a p-type germanium single crystal 21, a reference surface 22, an n-type diffusion layer 24 formed by thermal diffusion of an n-type impurity (P or As), a pn junction 25, an anti-reflective film 26, a positive electrode 27 made of tin containing a small amount of indium and in ohmic contact with the p-type germanium single crystal 21, and a negative electrode 28 in ohmic contact with the n-type diffusion layer 24 made of tin containing a small amount of antimony.

Figure 3:
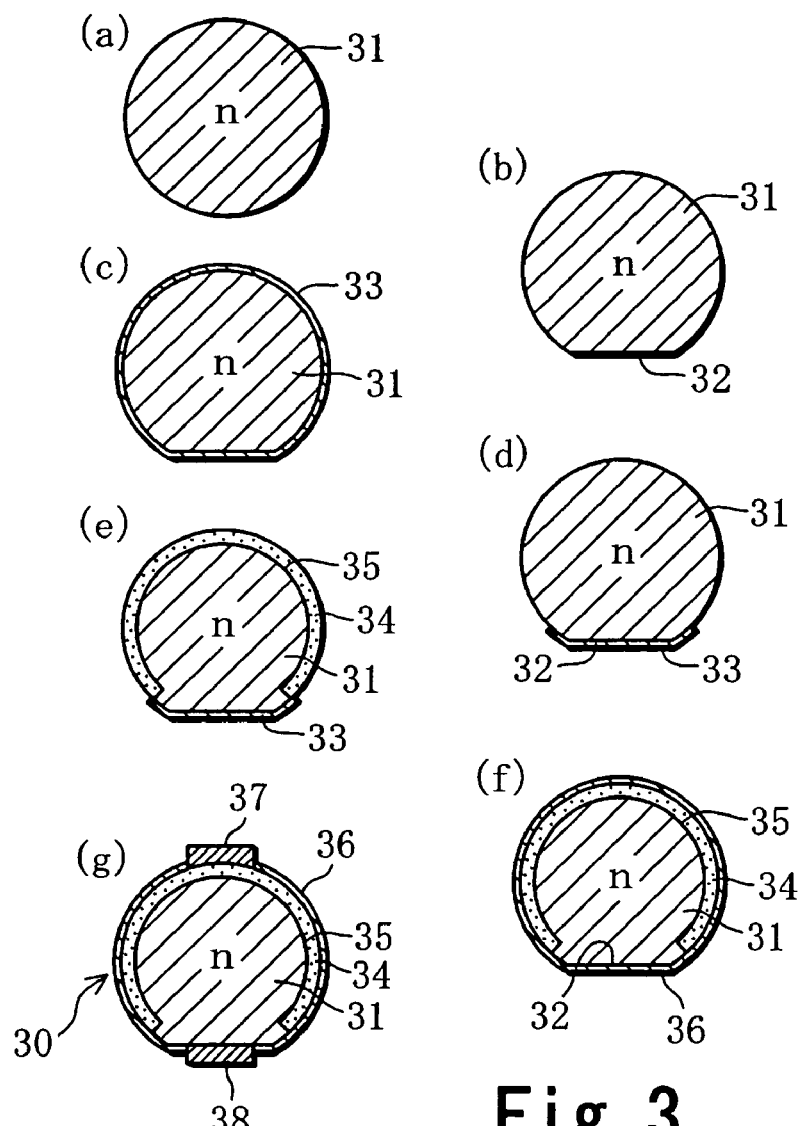
FIG. 3 shows sectional views of GaP single crystal, etc. in multiple processes for manufacturing GaP solar cells.

FIG. 3(a)~(g) show the manufacturing processes in the case of manufacturing a nearly spherical GaP solar cell 30 to be incorporated into a solar cell module having sensitivity wavelength bands of a short-wavelength region (about 300~600 nm) in the sunlight spectrum and is prepared with a nearly spherical gallium-phosphorus (GaP) single crystal. Gallium-phosphorus (GaP) is an indirect transition-type semiconductor having an energy band gap of about 2.25 eV. The GaP solar cell 30 has sensitivity wavelength bands on the side of short wavelengths in the sunlight spectrum. When the solar cell 30 is prepared, first, a cube with one side of about 1.6 mm is cut from an n-type GaP single crystal ingot, processed by a mechano-chemical polishing method to prepare a spherical n-type GaP single crystal 31 of about 1.2 mm in diameter as shown in FIG. 3(a). Next, as shown in FIG. 3(b), the lower end of spherical n-type GaP single crystal 31 is cut to form a reference surface 32, and as shown in FIG. 3(c), a silicon nitride film 33 ($Si_3N_4$) is formed on the entire surface of GaP single crystal 31. Next, as shown in FIG. 3(d), the silicon nitride film 33 at the reference surface 32 and in the vicinity of its periphery remains as a diffusion mask, and the silicon nitride film 33 other than the portion is removed.

As shown in FIG. 3(e), an p-type impurity such as zinc (Zn), etc. is diffused to form a diffusion layer 34 made of p-type GaP and a nearly spherical pn junction 35 on a boundary of the diffusion layer 34 and the n-type GaP single crystal 31. After forming the diffusion layer 34 and the nearly spherical pn junction 35, the silicon nitride film 33 used as the diffusion mask is completely removed. Next, as shown in FIG. 3(f), a thin anti-reflective film 36 made of a thin silicon oxide film is formed on the entire surface. Then, as shown in FIG. 3(g), a paste containing gold as main component and zinc and germanium as dopants, respectively are coated in dots at the center of surface of p-type diffusion layer 34 and at the center of reference surface 32 facing the n-type GaP single crystal 31 and heat-treated at a high temperature for a short time, a metal such as gold, etc. passes through the thin silicon oxide film to provide a positive electrode 37 and a negative electrode 38 in ohmic contact with the p-type GaP layer 34 and the n-type GaP single crystal 31, respectively.

FIG. 4(a)~(d) show manufacturing processes for manufacturing a nearly spherical silicon GaAl As/GaAs solar cell 40 comprising a GaAs solar cell to be incorporated into a solar cell module having sensitivity wavelength bands of a short-wavelength region (about 500~850 nm) in the sunlight spectrum and is prepared with a nearly spherical gallium-arsenic (GaAs) as main component. Gallium-arsenic (GaAs) is a direct transition-type semiconductor having an energy band gap of 1.43 eV and an energy band gap between the above Si and GaP.

Figure 4:
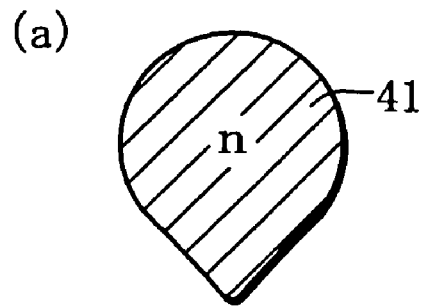
FIG. 4 is sectional views of GaAs single crystal, etc. in multiple processes for manufacturing GaAlAs/GaAs solar cells.
Figure 4:
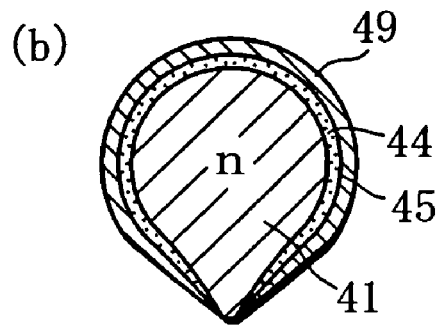
Figure 4:
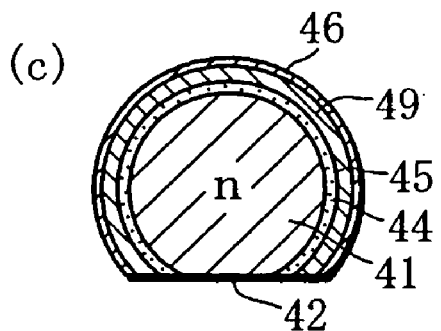
Figure 4:
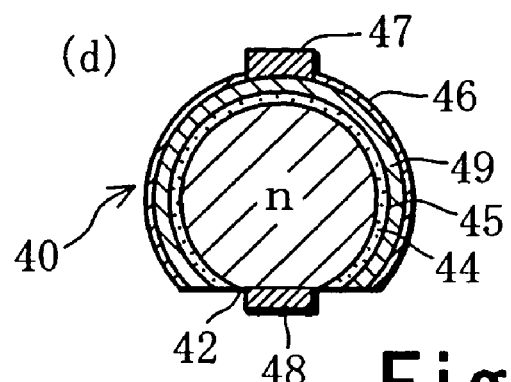

First, as shown in FIG. 4(a), a nearly spherical n-type GaAs single crystal 41 of about 1.2 mm in diameter is prepared. This GaAs single crystal 41 can be formed in the shape of a sphere by a mechano-chemical technique like the GaP single crystal 31. However, it can be prepared by the method proposed by the inventor in Japanese Patent No. 3287579 to reduce the loss of raw material and to provide a satisfactory single crystal. This method is carried out by vacuum sealing the n-type GaAs raw material and a small amount of As in a quartz ampule, then cooling and solidifying the internal GaAs in a hot melted state by heating from the outside while allowing it to freely fall. The GaAs fusion is made spherical due to surface tension in a micro-gravitational state during free fall and is rapidly solidified by adding a physical stimulus (trigger) in the super-cooled state to make a nearly spherical GaAs single crystal 41 as shown in FIG. 4(a). Next, as shown in FIG. 4(b), a p-type $Ga_{0.2}Al_{0.8}As$ layer 49 (a ternary mixed crystal semiconductor) is thin-film grown by the liquid-phase epitaxial method. In this case, the n-type GaAs single crystal 41 is dipped at a high temperature for a short time in a Ga fusion reservoir added with a GaAs source and a little dopant zinc into the Ga fusant, then cooled, and the p-type $Ga_{0.2}Al_{0.8}As$ layer 49 is epitaxially grown on the surface.

During the crystal growth of $Ga_{0.2}Al_{0.8}As$, zinc diffuses to the n-type GaAs single crystal 41, a p-type GaAs layer 44 is formed, and a pn junction 45 is formed on the surface of the GaAs layer 44.

Next, as shown in FIG. 4(c), an anti-reflective film 46 consisting of a silicon oxide film is formed on the surface, and a projection of surface of the n-type GaAs single crystal 41 is horizontally cut to form a reference surface 41 of about 0.3~0.5 mm in diameter. Next, as shown in FIG. 4(d), a paste containing gold as main component and zinc, and germanium as dopant, respectively are coated in dots at the center of surface facing the p-type $Ga_{0.2}Al_{0.8}As$ layer 49 and at the center of reference surface 42 facing the n-type GaAlAs single crystal 41 and heat-treated at a high temperature for a short time, a metal such as gold, etc. passes through the thin silicon oxide film 46 (anti-reflective film) to form a positive electrode 47 and a negative electrode 48 in ohmic contact with the p-type GaAlAs layer 49 and the n-type GaAs single crystal 41, respectively.

Moreover, in the preparation of the GaAlAS/GaAs solar cell 40, the sensitivity wavelength bands can be shifted to the short wavelength side by forming a pn junction 45 in the p-type GaAlAs layer 49 or by changing the compositional ratio of GaAlAs layer 49 to change the energy band gap. Furthermore, impurities may also be diffused into the spherical n-type GaAs single crystal 41 to form a homojunction type pn junction without providing the GaAlAs layer 49.

Figure 5:
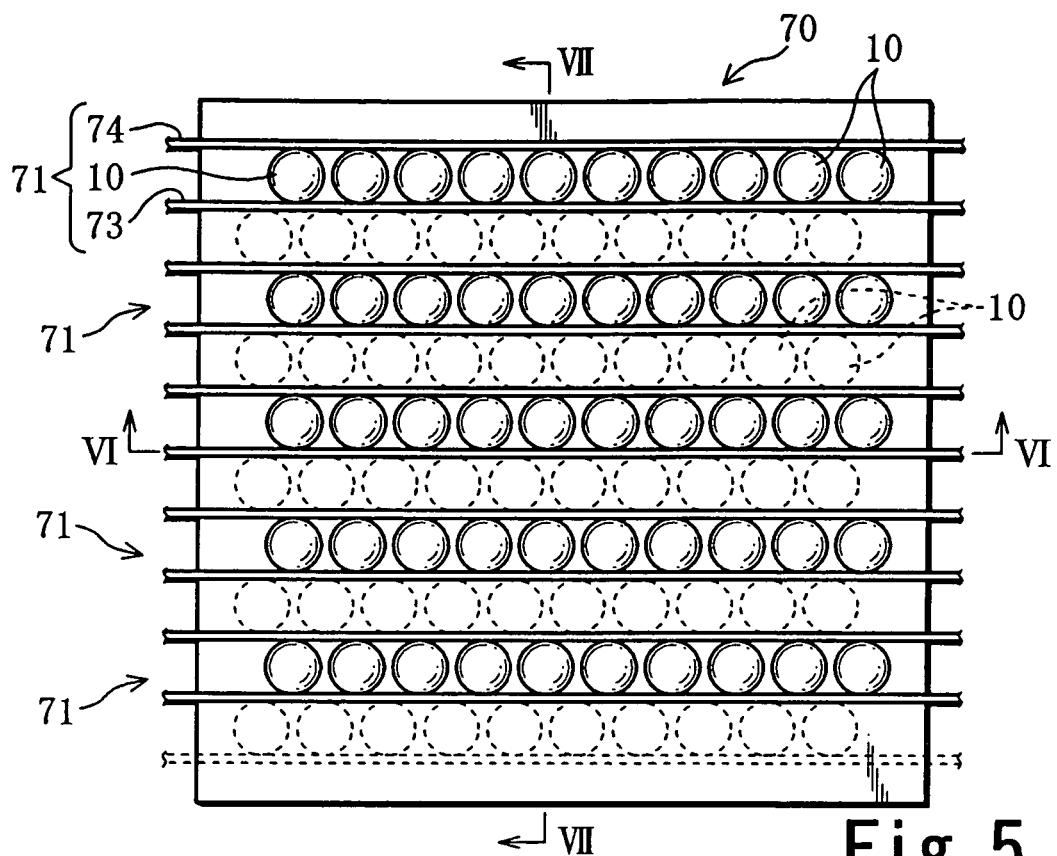
FIG. 5 is a plane view of a Si cell group module.
Figure 6:
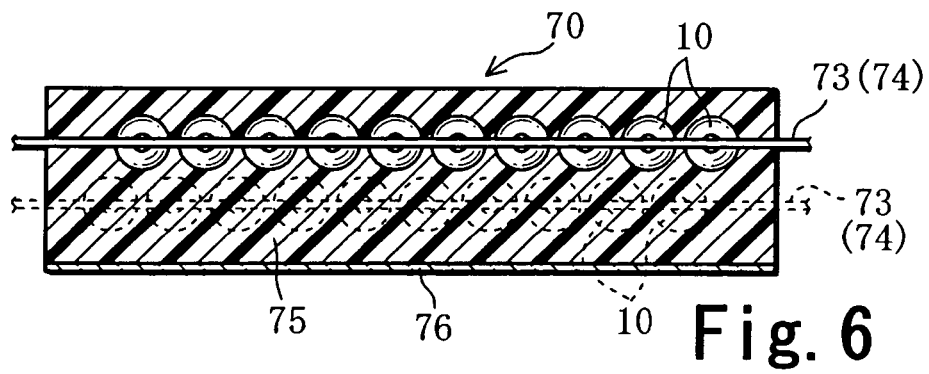
FIG. 6 is a VI-VI line sectional view of FIG. 5.
Figure 7:
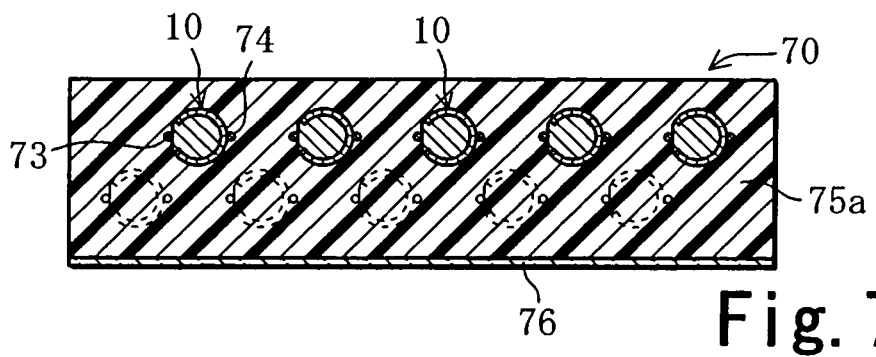
FIG. 7 is a VII-VII line sectional view of FIG. 5.

FIG. 5~FIG. 7 show a Si cell group module 70 (a Si solar cell module) incorporated with multiple Si solar cells 10 in plural columns and plural rows. FIG. 5~FIG. 7 show an example of a module conceptually incorporated with 100 cells, but several hundred or several thousand Si solar cells 10 will be incorporated into an actual Si cell group module.

The structure and preparation of the Si cell group module 70 are described on the basis of FIG. 5~FIG. 7. First, a Si solar cell array 71 in which 10 solar cells are connected in parallel at an equal pitch between a pair of lead wires (silver-plated on copper wires of about 1 mm in diameter) is prepared.

A positive lead wire 73 is soldered to a positive electrode 18 and a negative lead wire 74 is soldered to a negative electrode 19 of solar cell 10, respectively, and 10 solar cell arrays 71 are prepared. Five solar cell arrays 71 are arranged in the upper layer at an equal spacing and in parallel and 5 solar cell arrays 71 are arranged in the lower layer at an equal spacing and in parallel, the lower-layer arrays 71 are located between the upper-layer array 71, the upper and lower solar cells 10 are arranged to approach without overlapping in a plane view, and all components are molded with a transparent synthetic resin 75a (e.g., a flexible silicone resin). Moreover, the upper and lower solar cells 10 are arranged to approach without overlapping in a side view. Solar cells of five rows and ten columns are arranged in a plane in the upper layer, and solar cells of five rows and ten columns are also arranged in a plane in the lower layer. An actual Si cell group module 70 incorporating a large number of solar cells 10 into a matrix of multiple columns and multiple rows becomes a thin panel-like structure having flexibility. However, it may also be constructed into a nonflexible module.

A transparent glass sheet 76 (about 0.2 mm in thickness) is bonded to the bottom surface of the synthetic resin 75a. The transparent glass sheet 76 holds the mechanical strength of the Si cell group module 70 and is utilized as a reference surface for forming joints with other solar cell modules. After the resin mold, both ends of the positive lead wire 73 and the negative lead wire 74 extend to the outside of transparent synthetic resin 75a to make electric connections with other solar cell arrays and other solar cell modules. A serial/parallel connection circuit 75 (see FIG. 16) for serial/parallel connecting electrically hundred of Si solar cells 10 are formed by using ten positive electrode lead wires 73 and ten negative electrode lead wires 74. The serial/parallel connection circuit 75 is described hereafter on the basis of FIG. 16.

Similarly, a cell group module 80 (a solar cell module) (see FIG. 17) can be prepared by incorporating Ge solar cells 20 in place of the Si solar cells 10 of the Si cell group module 70. A cell group module 90 (a solar cell module) (see FIG. 13) can be prepared by incorporating GaP solar cells 30 in place of the Si solar cells 10. A cell group module 100 (a solar cell module) (see FIG. 13, FIG. 17) can be prepared by incorporating GaAlAs/GaAs solar cells 40 in place of the Si solar cells 10. Serial/parallel connection circuits in these modules 80, 90, 100 are same as the serial/parallel connection circuit 75 of Si cell group module 70 and will be described hereafter.

Moreover, such a solar cell module incorporated with multiple spherical solar cells is disclosed by the inventor in International Publication WO 2004/001858, etc.

Figure 8:
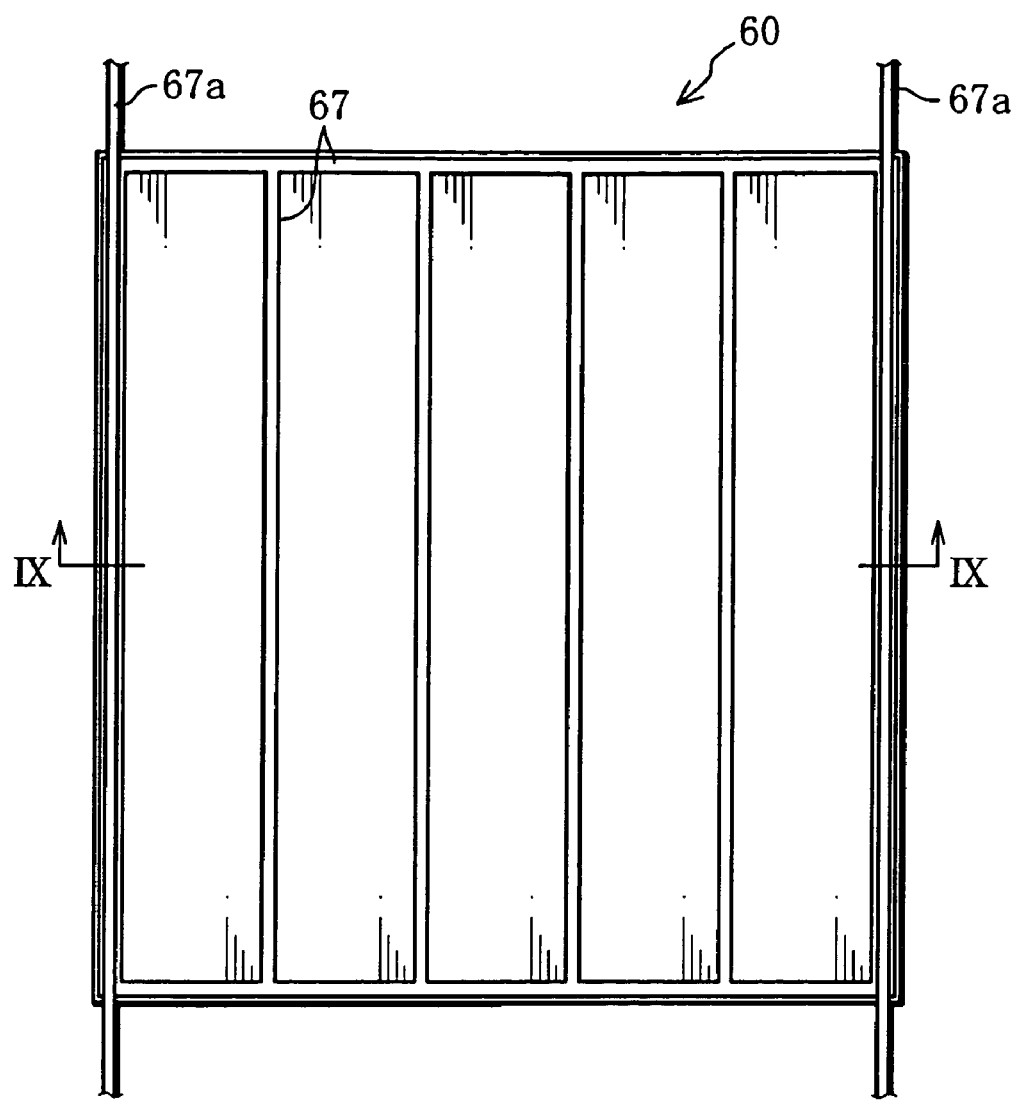
FIG. 8 is a plane view of an InGaAs/InP planar light receiving module.
Figure 9:
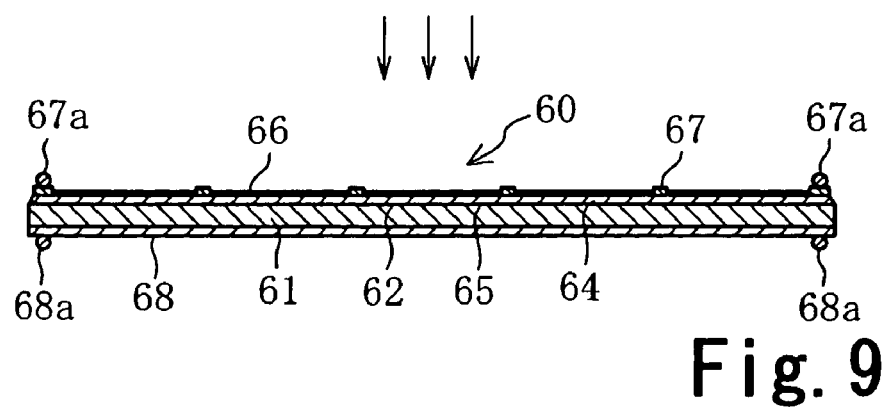
FIG. 9 shows an IX-IX line sectional view of FIG. 8.

Next, FIG. 8, FIG. 9 show an InGaAs/InP planar light receiving module 60 as a solar cell module to be incorporated into the laminated solar battery of this application and is an example of a solar cell module (an element module) having sensitivity wavelength bands in the long-wavelength region (about 900~1700 nm) in the sunlight spectrum.

An n-type $In_{0.53}Ga_{0.47}As$ layer 62 is epitaxially grown on the surface of an n-type InP substrate 61, and zinc as a p-type impurity is diffused on the n-type layer to form a p-type type $In_{0.53}Ga_{0.47}As$ layer 64 and a planar common pn junction 65. Except for the edge of n-type $In_{0.53}Ga_{0.47}As$ layer 62, a p-type impurity remain and may be selectively diffused to form a p-type layer 64 by using $Si_3N_4$ as a diffusion mask during this diffusion.

An n-type InP with a greater energy band gap than the layer 64 is epitaxially grown on the InGaAs layer 64, and a p-type impurity may also be diffused from the surface to form a pn junction in the InGaAs layer 64. The recombination velocity on the surface can be reduced by providing an InP layer as a window layer to improve the photo-electric conversion efficiency. The compositional ratio of the In to Ga can be changed no more than exemplified.

Next, a cold-mirror film 66 is formed on the surface of p-type InGaAs layer 64 forming the light receiving surface shown in FIG. 8. The cold-mirror film 66 is constructed with a dielectric multi-layer film set up to reflect light of about 1100 nm or below in wavelength and transmit light of a wavelength above it. The dielectric multi-layer film is obtained by alternately laminating a high refractive index dielectric ($TiO_2$ or $Ta_2O_5$, etc.) film and a low refractive index dielectric ($SiO_2$, etc.) film, and respective thickness and number of films are set up by considering the reflecting wavelength and the reflectivity.

A negative electrode 68 (gold containing a small quantity of germanium and nickel) is provided over the entire bottom surface of n-type InP substrate 61 so as to make ohmic contact with it, and a positive electrode 67 (gold containing a small quantity of zinc) made into the shape of stripe is provided on the surface of p-type InGaAs layer 64 so as to be in ohmic contact with it to increase the light receiving area. This planar light receiving module 60 can be manufactured on the basis of a manufacturing technique of long-wavelength photodiode using well-known InGaAs/InP. Next, a positive electrode 67a and a negative electrode 68a consisting of lead wires silver-plated on copper are soldered to the positive electrode 67 and the negative electrode 68, respectively.

Figure 10:
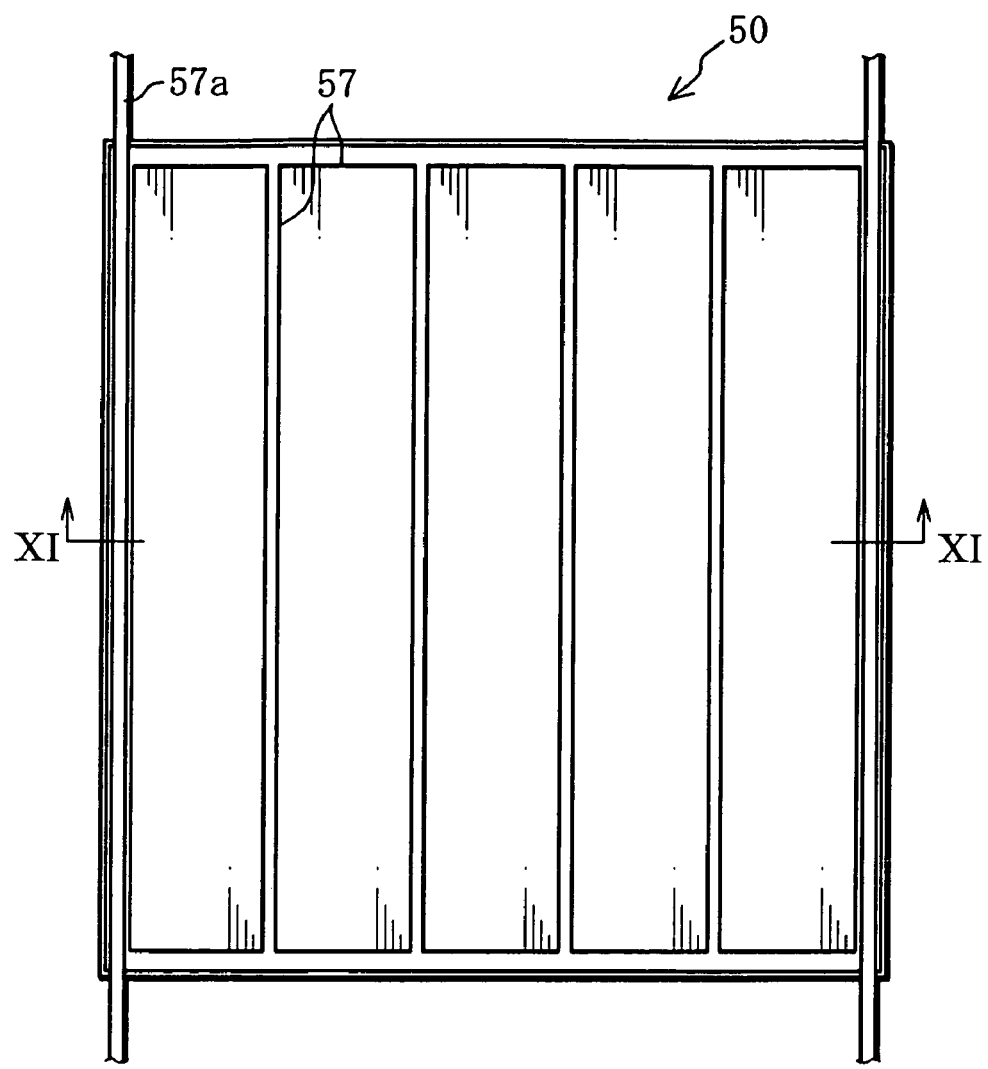
FIG. 10 is a plane view of a GaAsP/GaP planar light receiving module.
Figure 11:
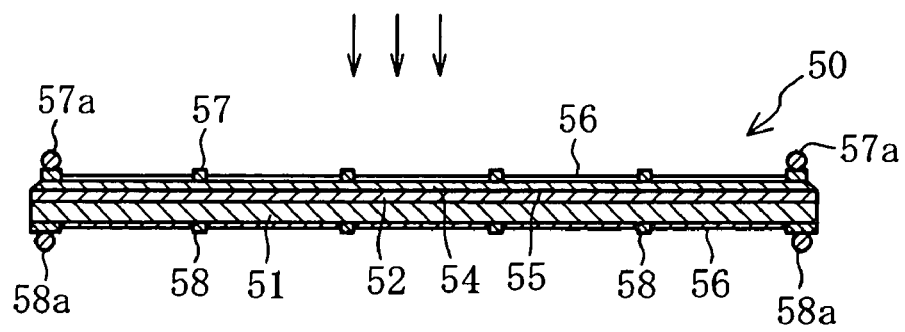
FIG. 11 is an XI-XI line sectional view of FIG. 10.

FIG. 10, FIG. 11 are a plane view and a sectional view of a GaAsP/GaP planar light receiving module 50 as a solar cell module to be incorporated into the laminated solar battery of this application and is an example of a solar cell module (element module) having short-wavelength region (about 300~600 nm) in the sunlight spectrum.

An n-type $GaAs_{0.1}P_{0.9}$ layer 52 is formed on an n-type GaP substrate 51 by the well-known gas-phase epitaxial growth method. In this composition, GaAsP is an indirect transition-type semiconductor with an energy band gap of about 2.21 eV. Next, p-type impurity zinc is diffused from the GaAsP layer 52 to form a p-type $GaAs_{0.1}P_{0.9}$ layer 54, and a pn junction 55 is formed in the GaAsP layer 54. A diffusion mask $Si_3N_4$ film is provided on the edge portion of the surface of the n-type GaAsP layer 52 to accomplish zinc diffusion and to form a planar pn junction. This method has also been used in a method of preparing a well-known yellow light-emitting diode (LED).

A positive electrode 57 (gold containing a small quantity of zinc) and a negative electrode 58 (gold containing a small quantity of germanium and nickel) in ohmic contact with the surface of p-type GaAsP layer 54 and n-type GaP substrate 51, respectively are provided. A great amount of light receiving area of planar light receiving module 50 is obtained, by which positive electrode 57 and the negative electrode 58 are made into fine stripes to make the positions of both sides to be even, as illustrated. A transparent anti-reflective film 56 is provided on the surface of the light receiving window enclosed by the stripe electrode 57. Moreover, the p-type GaAsP layer 54 becomes the light receiving surface of the GaAsP/GaP planar light receiving module 50, in the case of solar battery 300 (see FIG. 17) described later, a long-wavelength light transmitting the GaAsP/GaP planar light receiving module 50 enters a three-layer solar cell module arranged below the module 50. Next, a positive lead wire 57a and a negative lead wire 58a are soldered to both ends of the positive electrode 57 and the negative electrode 58 and electrically connected with lead wires (0.1 mm in diameter) silver-plated on a copper wire, respectively, the lead wires 57a, 58a being led to the outside of the planar light receiving module 50.

The laminated solar battery 200 of Example 1 is described hereafter.

Figure 12:
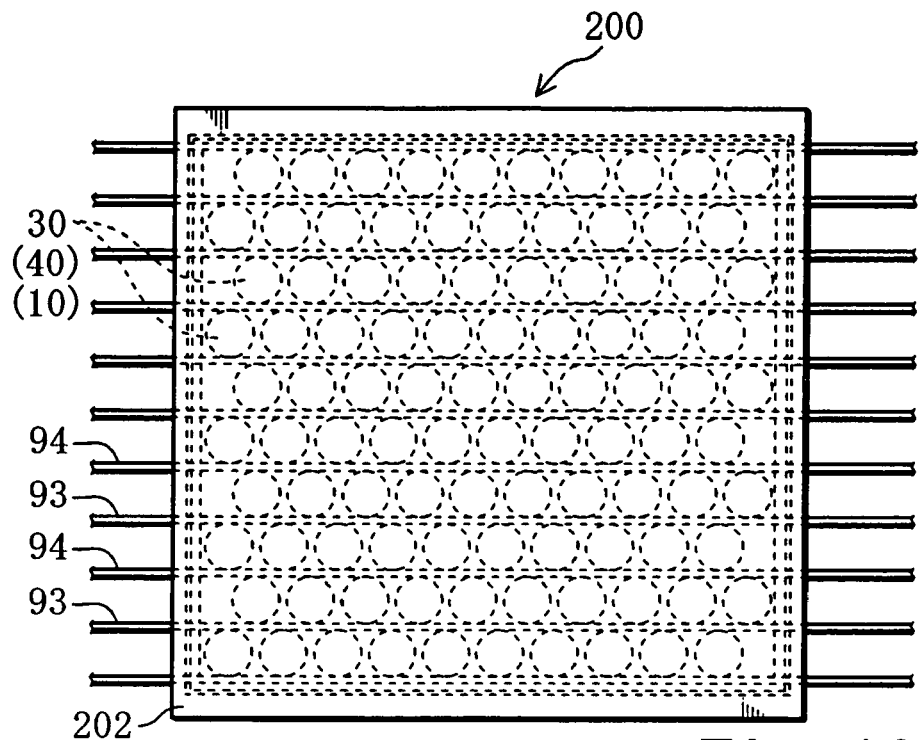
FIG. 12 is a plane view of a laminated solar battery of Example 1.
Figure 13:
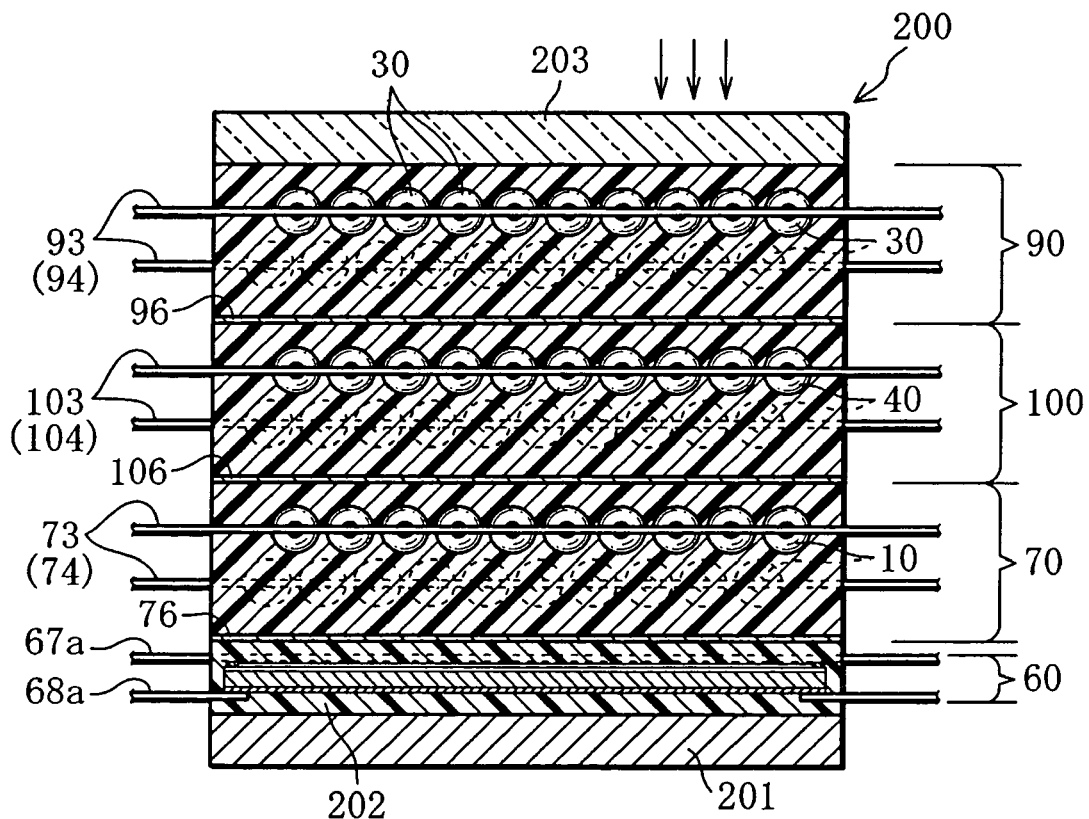
FIG. 13 is a sectional view of the laminated solar battery of FIG. 12.

FIG. 12, FIG. 13 are a plane view and a sectional view of the laminated solar battery 200 constructed by four types of four solar cell modules, i.e., a GaP cell group module 90, a GaAlAs/GaAs cell group module 100, a Si cell group module 70 and an InGaAs/InP planar light receiving module 60.

In this laminated solar battery 200, the cell group modules 90, 100, 70 and 60 having different sensitivity wavelength bands to the sunlight spectrum are laminated so that the shorter the center wavelength of the module in the sensitivity wavelength band is, the more near the module is located toward the incidental side of the sunlight. As is known from FIG. 14, the center wavelength at the sensitivity wavelength bands of solar cell modules 90, 100, 70 and 60 has a relationship such that the center wavelength of module 90 (about 450 nm)<the center wavelength of module 100 (about 700 nm)<the center wavelength of module 70 (about 800 nm)<the center wavelength of module 60 (about 1,300 nm). Therefore, an aluminum nitride substrate 201 is arranged in the lowest layer, the InGaAs/InP planar light receiving module 60 incorporated in a transparent synthetic resin 202, the Si cell group module 70, the GaAlAs/GaAs cell group module 100 and the GaP cell group module 90 are sequentially laminated and bonded with a transparent adhesive, and a transparent glass cover 203 is placed on the top layer forming a light receiving surface for receiving the sunlight and bonded with transparent adhesive.

Figure 16:
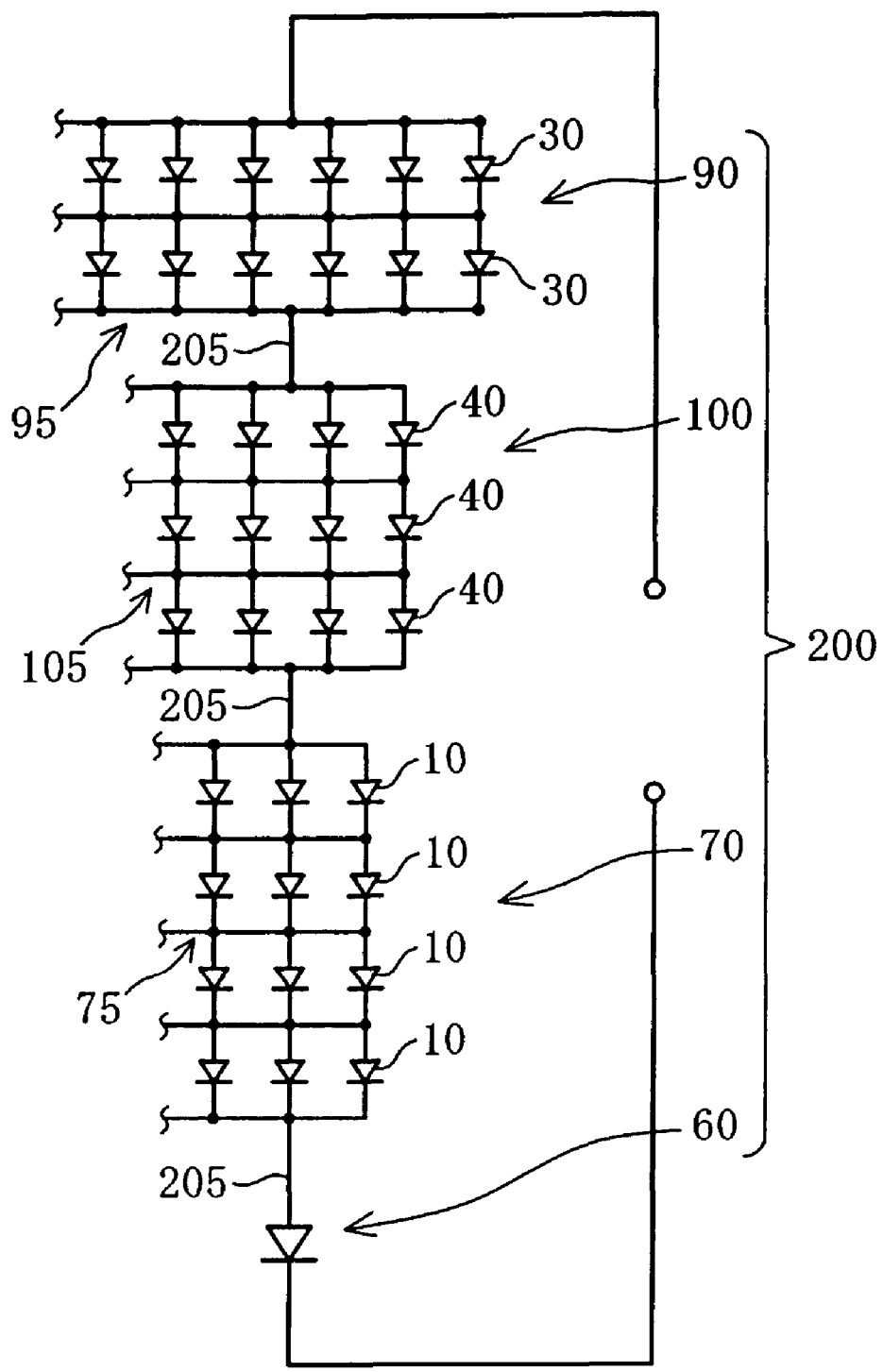
FIG. 16 is a schematic circuit diagram of serial/parallel connection circuits and a series connection circuit in the solar battery of Example 1.

The positive/negative electrode lead wires 67a, 68a of module 60, positive/negative electrode lead wires 73, 74 of module 70, positive/negative electrode lead wires 103, 104 of module 100, positive/negative electrode lead wires 93, 94 of module 90 extend to the outside of module, respectively and constitute serial/parallel connection circuits 75, 105 and 95 of respective modules 70, 100 and 90 (see FIG. 16).

Figure 14:
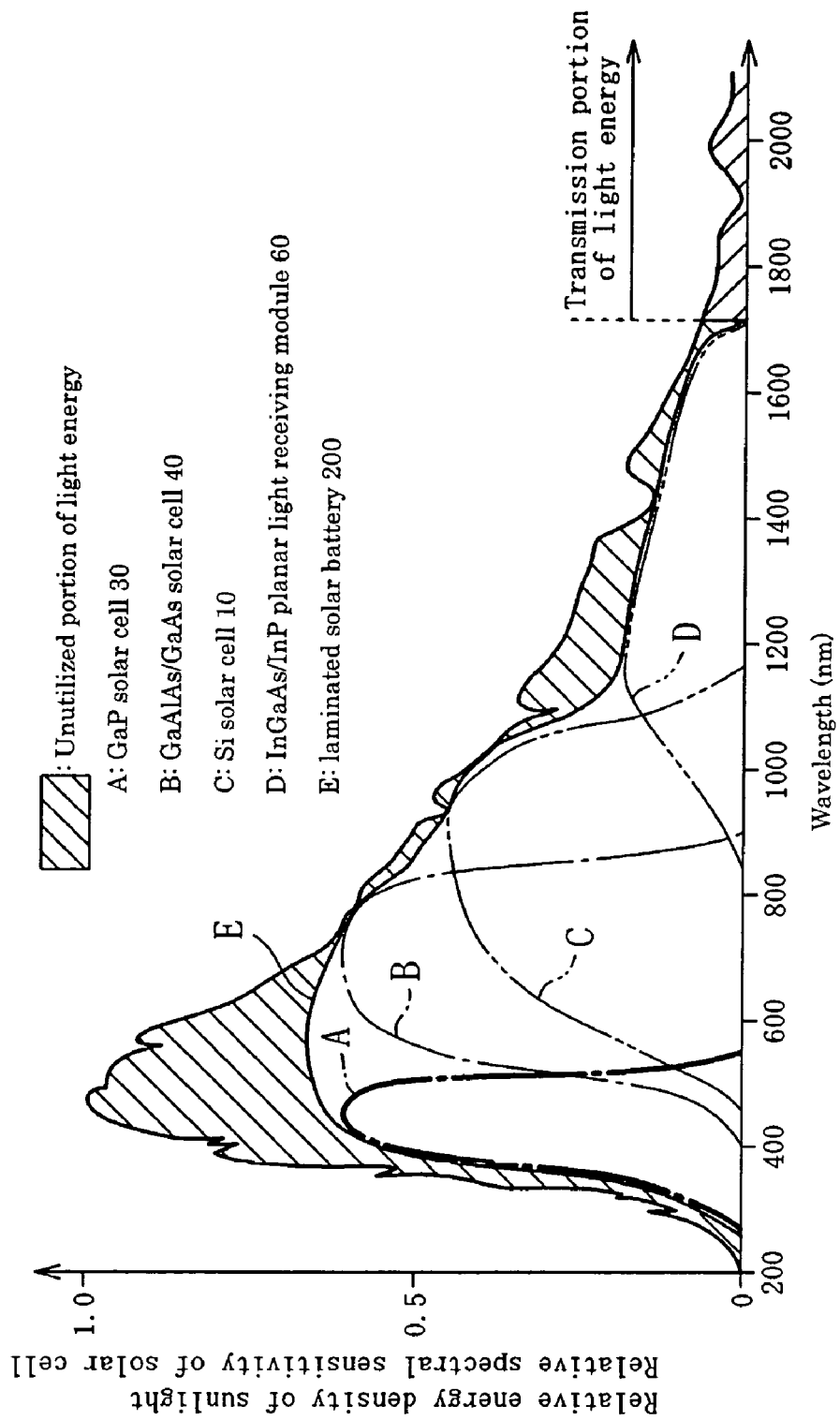
FIG. 14 is a diagram of the relative energy density of sunlight and relative spectral sensitivity of solar cells incorporated into the solar battery of Example 1.

FIG. 14 is a diagram which conceptually shows the sunlight spectrum obtained by a sunlight spectrum analyzer, the spectral sensitivity characteristic of the laminated solar battery 200 and the spectral sensitivity characteristics of solar cells 30, 40 and 10, etc. in separate use.

In FIG. 14, the gap zone (hatched zone) in the spectral sensitivity characteristics of the sunlight spectrum comprises a portion of unutilized energy which is photo-electrically non-convertible in the laminated solar battery 200. A long-wavelength spectral section beyond the sensitive wavelength region of the spectral sensitivity characteristics of laminated solar battery 200 is an unutilized energy portion which passes through the solar battery 200. It is desirable to minimize all of these because they represent photo-electrically non-convertible energy losses.

In the respective and separate modules 90, 100, 70 and 60, not only are the sensitivity wavelength bands narrow, but also a portion of received light energy which is too much greater than the band gap cannot be effectively utilized as output. FIG. 14 shows that a usable wavelength region (a white background portion) is expanded by laminating and combining solar cell modules with different energy gaps (corresponding to sensitivity wavelength bands) and provides high photo-electric conversion efficiency.

Figure 15:
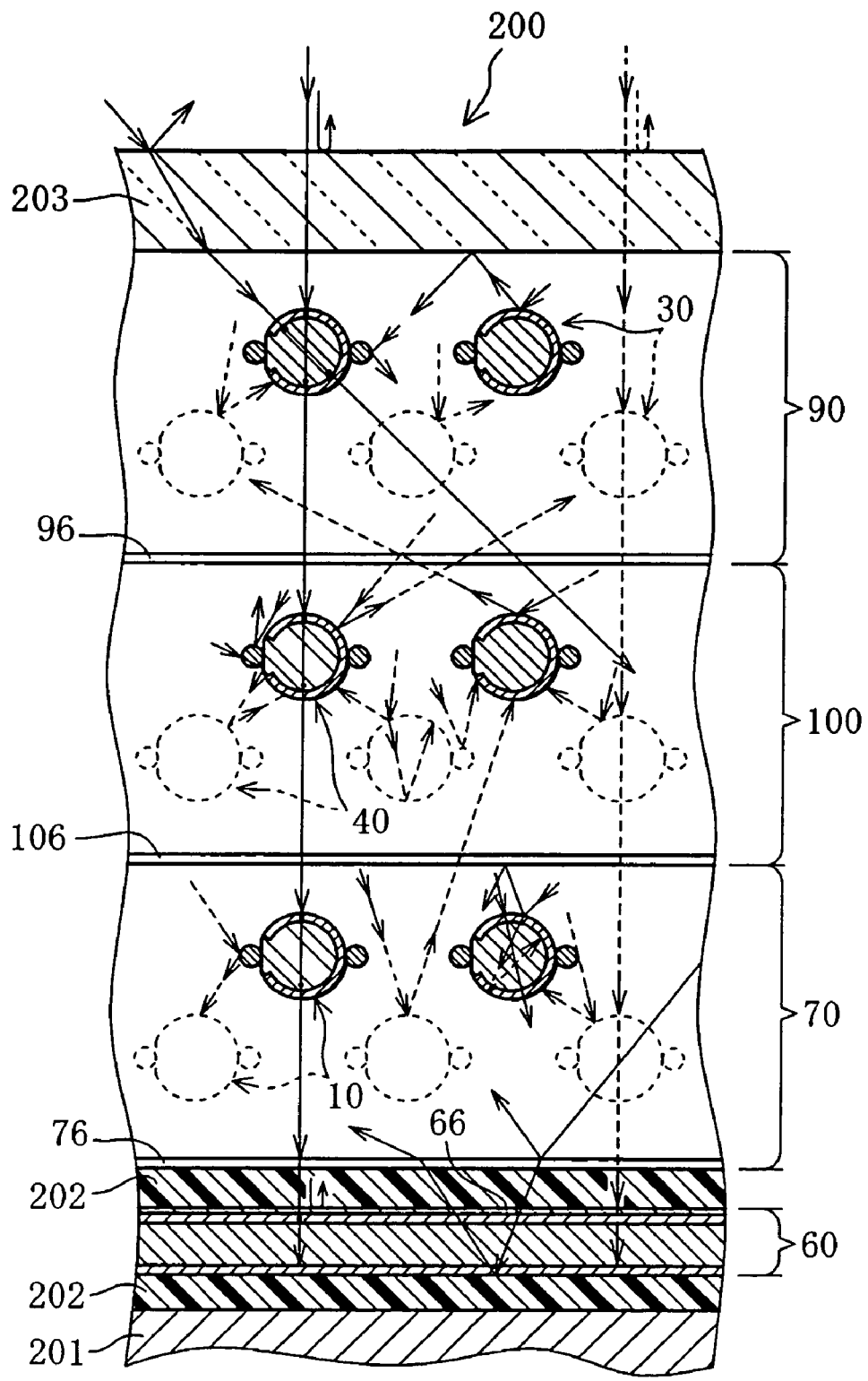
FIG. 15 is an illustrative diagram for describing the incidence, reflection and absorption in the solar battery of Example 1.

FIG. 15 is an illustrative diagram in which the optical path of incident light, the optical path of reflected light, and the mode of reflection and absorption are described as the following three cases. From this diagram, the effects of the laminated solar battery 200 incorporated with spherical and nearly spherical solar cells 30, 40 and 10 are known.

Case 1: A case in which sunlight perpendicularly incidental to a transparent cover glass 203 travels perpendicularly through the solar cells 30, 40, 10 and the module 60.

Except for light reflecting at interfaces due to different refractive indices and light absorbed by substances other than solar cells, direct sunlight is basically absorbed in accordance with characteristics of solar cells reflecting the energy band gap and contributes to photo-electric conversion. In solar battery 200, solar cells 30, 40 and 10 and module 60 are sequentially arranged as the high energy band gap from the incidental side of sunlight, therefore the sunlight is absorbed by the solar cells 30, 40 and 10 and module 60 from short wavelength light to long wavelength light. The incidental light uncut by upper cells on the incidental side enters next stage solar cells, the uncut light enters the lower next stage solar cells, and light not absorbed by the final module 60 becomes transmission loss.

Thus, the upper solar cells serves as a filter to the lower solar cells and the module 60, reducing the proportion of receiving excessive light energy and its conversion to heat energy. The beam cold mirror 66 formed on the upper side of InGaAs/InP planar receiving module 60 having the longest sensitivity wavelength band reflects the light of a shorter wavelength region than the light of the longest wavelength capable of photo-electric change by the Si solar cell 10 and functions as a filter transmitting the light of a wavelength region longer than the light, thereby preventing the InGaAs/InP planar receiving module 60 from absorbing excessively large light energy, suppresses the temperature rise of planar receiving module 60 and improves its durability. Similarly, the upper solar cells absorbs and photo-electrically converts a light having an excessive energy to the lower solar cells, suppressing a temperature rise of solar cells 100 and 70.

In nearly spherical solar cells, when light transmits the solar cells, light absorption occurs in the direction from the incidental point according to the magnitude of light energy but the same pn junction also exists on the opposite side from the center of solar cells, with the strong point that long-wavelength light in the sensitivity wavelength bands is absorbed and the sensitivity wavelength bands are expanded.

Case 2: An incident light is reflected by the surface of solar cells.

As shown in FIG. 15, light reflected by the surface of spherical solar cells enters other solar cells, and the absorption and transmission of light occurs according to their optical characteristics. Light reflection is also produced not only by the solar cells but also by positive/negative lead wires of solar cells and transparent glass sheets 96, 106, 76. The reflected light repeats reflection and diffusion throughout the modules 90, 100, 70 and 60. Therefore, the light is also incidental to the downside of the solar cells (the side opposite that of the light receiving side) not reached by the direct light with the effect of increasing the output of all of the solar cells, enabling further enhancement of light passing through the upper solar cells by in terms of how to arrange the lower solar cells, transparent glass or filter such as $TiO_2$, etc.

Case 3: Capture and confinement of sunlight obliquely incidental to the surface to within the solar cells. The refractive indices of solar cells 30, 40 and 10 are large, therefore the effect of confinement of light by overall reflection occurs in the solar cells depending upon the angle of incidental sunlight, and a component being photo-electrically converted by the pn junction in the solar cells is generated and increased output can also be anticipated.

Case 4: Confinement of light between the glass cover glass 203 and the cold mirror 66 of module 60 improves light absorptivity and efficiency of photo-electric conversion.

FIG. 16 shows an example of the series connection circuit 205 where the modules 90, 100, 70 and 60 are connected in series and the optimum serial/parallel connection circuits 95, 105 and 75 in which multiple solar cells 30, 40 and 10 are connected in serial and parallel in modules 90, 100 and 70 in the laminated solar battery 200 made by laminating the modules 90, 100, 70 and 60 of an equal surface area of the light receiving portion. The serial/parallel connection circuits 95, 105 and 75 are basically constructed so that the output currents of modules 90, 10 and 70 are made equal to the output current of module 60 with the smallest output current, and serial/parallel connection circuits 95, 105 and 75 are constituted with positive/negative electrode lead wires 93, 95, 103, 104, 73, 74, 67a and 68a.

When the maximum output current of InGaAs/InP planar receiving module 60 is I, an example is described in which the maximum output current in the case of connecting all of the solar cells 30 of the GaP cell group module 90 in parallel is assumed to be 2I, and the maximum output current in the case of connecting all of the solar cells 40 of the GaAlAs/GaAs cell group module 100 in parallel is assumed to be 3I, and the maximum output current in the case of connecting all of the solar cells 10 of the Si cell group module 70 is assumed to be 4I. As shown in FIG. 16, if the number of series connections of the serial/parallel connection circuit 95 is set to 2 in the module 90, the output current becomes I. If the number of series connections of the serial/parallel connection circuit 105 is set to 3 in the module 100, the output current becomes I. If the number of series connections of the serial/parallel connection circuit 75 is set to 4 in the module 70, the output current becomes I. Hence, the output current of module 90, 100 and 70 become I, respectively, becoming equal to the output current of module 60. If they are constructed so that the output currents of modules 90, 100, 70 and 60 are the same, the modules 90, 100, 70 display the maximum generating capacity.

Specifically, the maximum output current of one solar cell 30, 40 and 10 is i30, i40, i10, respectively, the number of parallel connections of multiple solar cell 30, 40, 10 is N30, N40, N10, and the output current of module 60 is I.

If the number of parallel connections is such that an expression i30×N30=i40×N40=i10×N10=I, the output currents of modules 90, 100, 70 and 60 become the nearly the same values.

Furthermore, if the maximum output voltage of one solar cell 30, 40, 10 is v30, v40, v10, respectively, the number of series connections of multiple solar cells 30, 40, 10 is M30, M40, M10, respectively, and the output voltage of module 60 is v60, the output voltage V of laminated solar battery 200 becomes V=(v30×M30)+(v40×M40)+(v10×M10)+v60.

Thus, the total output power of the laminated solar battery 200 can be maximized by adjusting the number of parallel connections and the number of serial connections for serial/parallel connections of solar cells in the plural modules 90, 100, 70 and 60 constituting the laminated solar battery 200.

Serial/parallel connection circuits 95, 105 and 75 can be constructed via the positive/negative lead wires being terminals of solar cell arrays, but they may also be so constructed that the serial/parallel connection circuits 95, 105 and 75 are switched by electronic switch circuits so as to maximize the output corresponding to the sunlight spectrum and the fluctuation of incident light to change the number of serial connections and the number of parallel connections. In the modules 90, 100 and 70, multiple solar cells are connected in parallel and the constructed solar cell arrays are connected in series via lead wires, therefore, even if a dispersion of characteristics occurs in multiple solar cells, the current corresponding to the dispersion is shared to minimize the module output reduction. Moreover, in a conventional laminated solar battery comprising planar modules, it is difficult to match the output currents by a serial/parallel connection such as that of the laminated solar battery 200 of the present invention.

In the laminated solar battery 200 as described above, the cell group modules 90, 100 and 70 are sequentially laminated from the top, with the planar light receiving module 60 being arranged in the lowest layer, and the shorter the center wavelength in the sensitive wavelength bands is, the more near the module is located to the incidental side of sunlight, therefore light deficient in transmissivity of short wavelengths is absorbed in the upper layer and light excellent in transmissivity of long wave-lengths is absorbed in the lower layer, thereby enhancing the photo-electric conversion efficiency of solar battery 200.

Cell group modules 90, 100 and 70 are incorporated in the upper three layers and the planar light receiving module 60 is incorporated in the lowest layer, favorable in the photo-electric conversion of a reflected light reflected by the planar light receiving module 60. Particularly, the cold mirror 66 reflecting a light of 1100 nm or below in wavelength easy to make the photo-electric conversion by the modules 90, 100 and 70 is provided in the module 60, favorable in enhancing photo-electric conversion efficiency by best use of the reflected light. Each of the cell group modules 90, 100 and 70 functions as a filter to its lower module 100, 70 and 60, respectively, making it difficult for the lower modules to become superheated, favorable to enhancing photo-electric conversion efficiency.

As shown in FIG. 14, the sensitive wavelength bands of modules 90, 100, 70 and 60 are properly set up, enabling the photo-electric conversion of a broad range light of the sun-light spectrum, obtaining the photo-electric conversion efficiency of the laminated solar battery 200 up to 50% or above.

Moreover, as shown in FIG. 16, serial/parallel connection circuits 95, 105, 75 are provided so that the respective output current of modules 90, 100 and 70 is made equal to the output current of module 60, fully displaying the power-generating function of laminated solar battery 200 and enhancing photo-electric conversion efficiency.

Furthermore, anti-reflective films 36, 46 and 17 are formed in the solar cells 30, 40 and 10 incorporated into modules 90, 100 and 70, respectively, the cell themselves reflect and obliquely diffuse incident light, the absorption effect of light increases and the confinement effect of light inside the laminated solar battery 200 also increases and effectively improves photo-electric conversion efficiency.

In modules 90, 100 and 70, the solar cells 30, 40, 10 are arranged in two layers, and the solar cells 30, 40 and 10 are densely arranged in the plane and side views, increasing the total area of the pn junction, improving photo-electric conversion efficiency.

Moreover, the direction defined by the positive/negative electrodes is directed to the horizontal direction in the solar cells 30, 40 and 10, when light enters the solar cells from the top, since there is the chance of meeting the pn junction at least twice, photo-electric conversion efficiency is improved, and is also improved by reflected light entering the solar cells from below.

Furthermore, the solar cells 30, 40 and 100 incorporated into modules 90, 100 and 70 respectively can be independently prepared without being affected by the lattice constant, etc. of semiconductors of other solar cell modules, excellent in the degree of freedom of design and preparation.

Next, a laminated solar battery 300 of Example 2 is described. However, the types of modules adopted in solar battery 300 are partly different from those of modules of solar battery 200, and they are only briefly described because they have the same structure as the solar battery 200.

Figure 17:
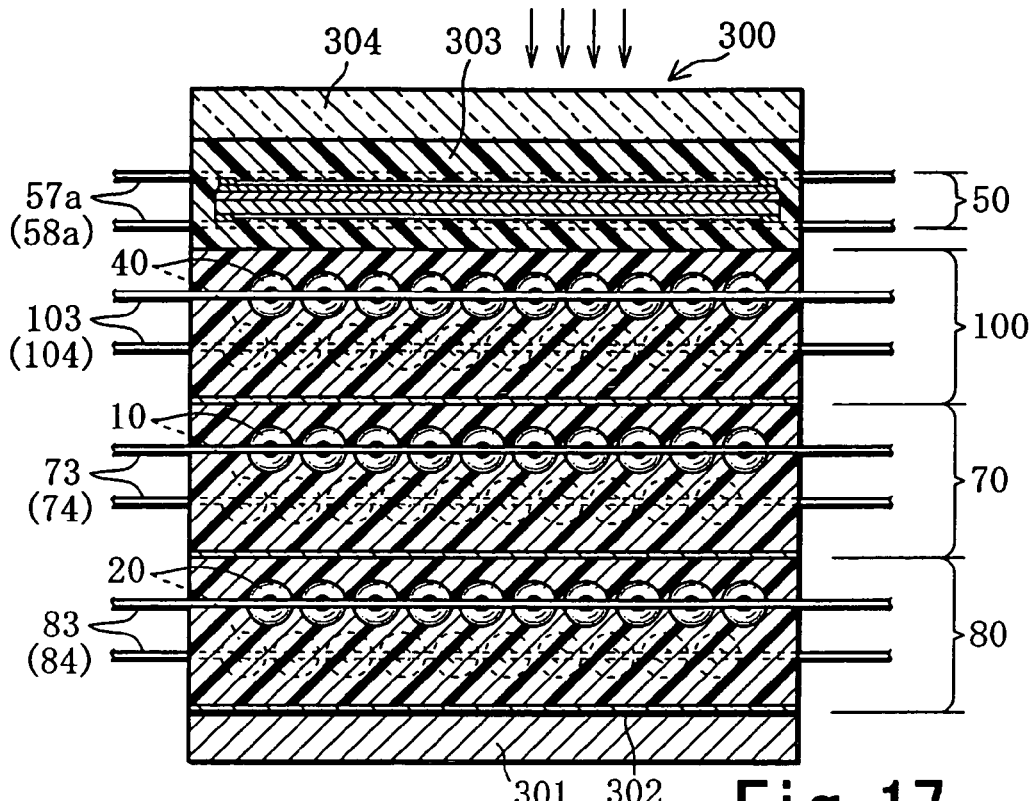
FIG. 17 is a sectional view of the solar battery of Example 2.
Figure 18:
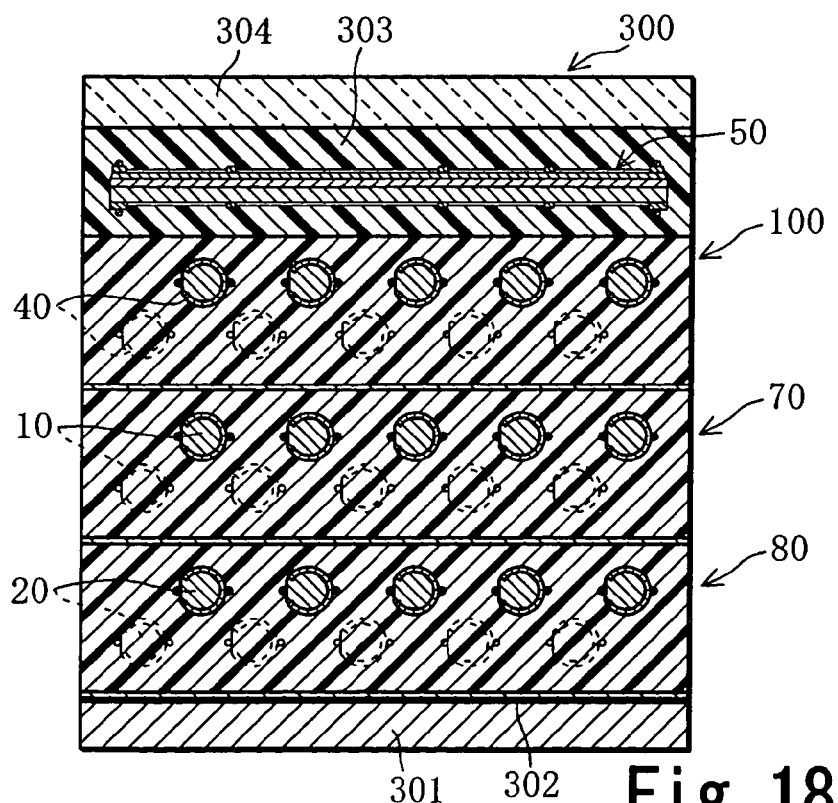
FIG. 18 is a sectional view of the solar battery of Example 2.

FIG. 17 and FIG. 18 are sectional views of the laminated solar battery 300 constituted with four types of four solar cell modules, i.e., GaAsP/GaP planar light receiving module 50, GaAlAs/GaAs cell group module 100, Si cell group module 70 and Ge cell group module 80.

Figure 19:
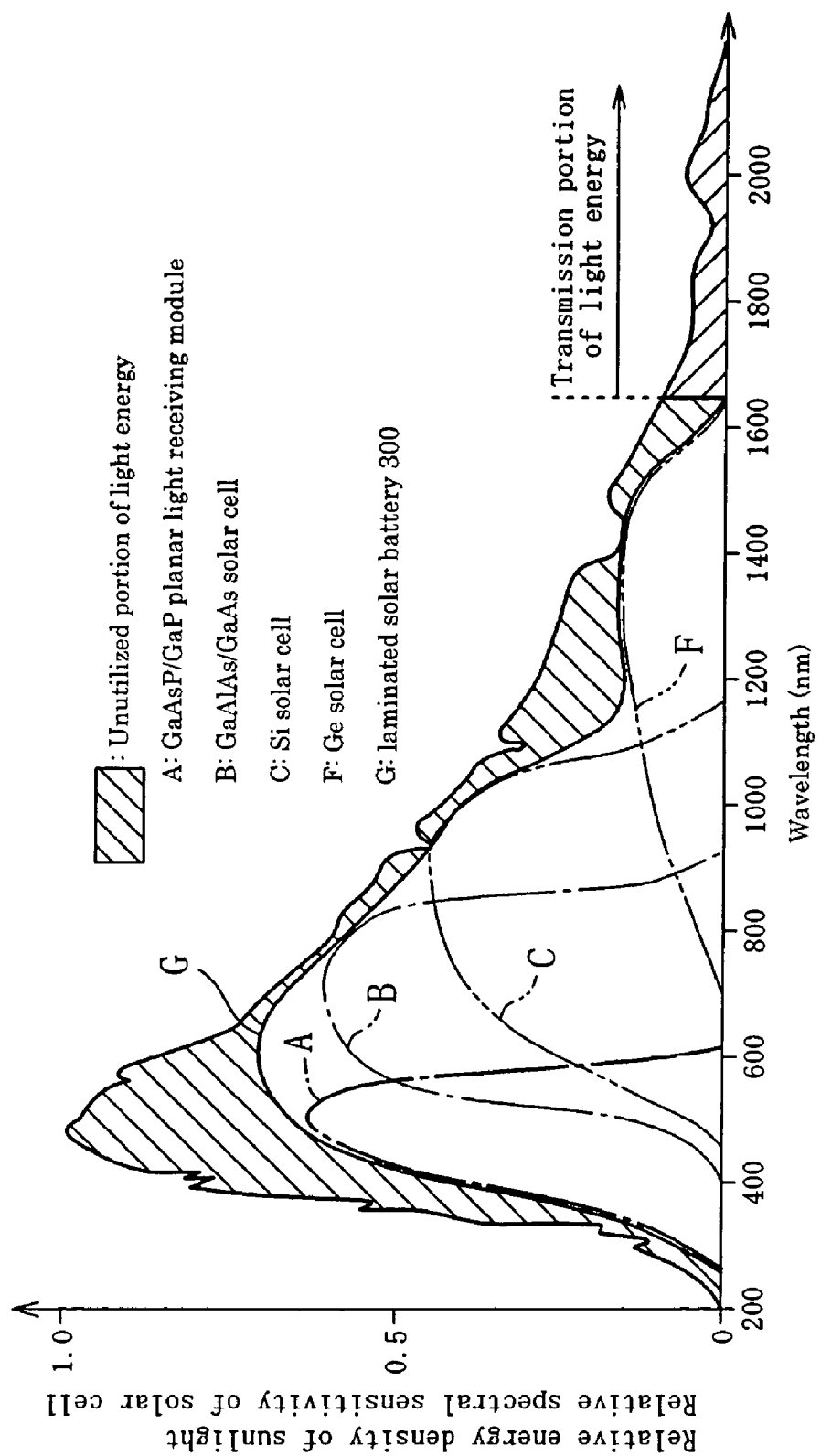
FIG. 19 is a diagram of relative energy density of sunlight and relative spectral sensitivity of solar cells incorporated into the solar battery of Example 2.

In this solar battery 300, solar cell modules having different sensitivity wavelength bands to the sun-light spectrum are laminated so that the shorter the center wavelength in the sensitivity wavelength band is, the more near the module is located to the incidental side of sunlight. As is also known from FIG. 19, the center wavelengths in the sensitivity wavelength band of solar cell modules 50, 100, 70 and 80 have a relationship such that the center wavelength of module 50 (about 450 nm)<the center wavelength of module 100 (about 700 nm)<the center wavelength of module 70 (about 800 nm)<the center wavelength of module 80 (about 1,200 nm). Therefore, an aluminum nitride substrate 301 is arranged in the lowest layer, Ge cell group module 80, Si cell group module 70, GaAlAs/GaAs cell group module 100, and GaAsP/GaP planar light receiving module 50 are sequentially laminated and bonded with a transparent adhesive, a transparent glass cover 304 is placed on the top layer forming a light receiving surface for receiving the sunlight and bonded with a transparent adhesive.

Positive/negative electrode lead wires 83, 84 of module 80, positive/negative electrode lead wires 73, 74 of module 70, positive/negative electrode lead wires 103, 104 of module 100, positive/negative electrode lead wires 57a, 58a of module 50 extend to the outside of module, respectively and construct respective serial/parallel connection circuits (not shown).

In solar battery 300, the GaAsP/GaP planar light receiving module 50 on the incident-most side photo-electrically converts light of the short-wavelength region, and light transmitting the module 50 is photo-electrically converted by the GaAlAs/GaAs solar cells 40 of below situated module 100, light transmitting the module 100 is photo-electrically converted by the Si solar cells 10 of the below situated module 70, and long-wavelength light transmitting the module 70 is photo-electrically converted by the Ge solar cells 20 of Ge cell group module 80.

An aluminum nitride substrate 301 coated with an aluminum reflective film 302 is fixed beneath the Ge cell group module 80 by means of transparent adhesive. The aluminum reflective film 302 serves as re-reflecting light passing through the above solar cells or light reflected within the modules to reduce an unutilized portion of sunlight.

As described on the basis of FIG. 15, reflection and scattering of light occurs among the solar cells 40, 10 and 20 of modules 100, 70 and 80 and is also incidental to the downside of solar cells and supplied to the photo-electric conversion. As described on the basis of FIG. 16, the output current of modules 100, 70 and 80 is made equal to the output current of module 50, respectively. Therefore, the optimum number of series connections and number of parallel connections in the serial/parallel connection circuits of modules 100, 70 and 80 are set up in accordance with the output characteristics of respective solar cells 40, 10 and 20.

In the laminated solar battery 300 described above, working advantages basically the same as the laminated solar battery 200 are obtained, and differences from the laminated solar battery 200 are simply described. The laminated solar battery 300 can be constituted effectively by the best use of the planar light receiving module 50 made of a GaAsP compound semiconductor which is difficult to construct in spherical solar cells and has sensitivity wavelength bands in the short-wavelength region of the sunlight spectrum. Moreover, the effect of confining light to the laminated solar battery 300 can be enhanced by an anti-reflective film formed in the planar light receiving module 50 of the top layer.

In the embodiments described above, planar light receiving modules 60 and 50 were utilized for the high-energy zone on the short wavelength side or the low-energy zone on the long wavelength side of the sunlight spectrum.

In the solar cell modules utilizing compound semiconductors for realizing high photo-electric conversion in such a wavelength region, spherical solar cells are not necessarily adopted, easily prepared planar light receiving modules are adopted and favorable in terms of cost effect.

A laminated solar battery relating to another embodiment is described next.

Figure 20:
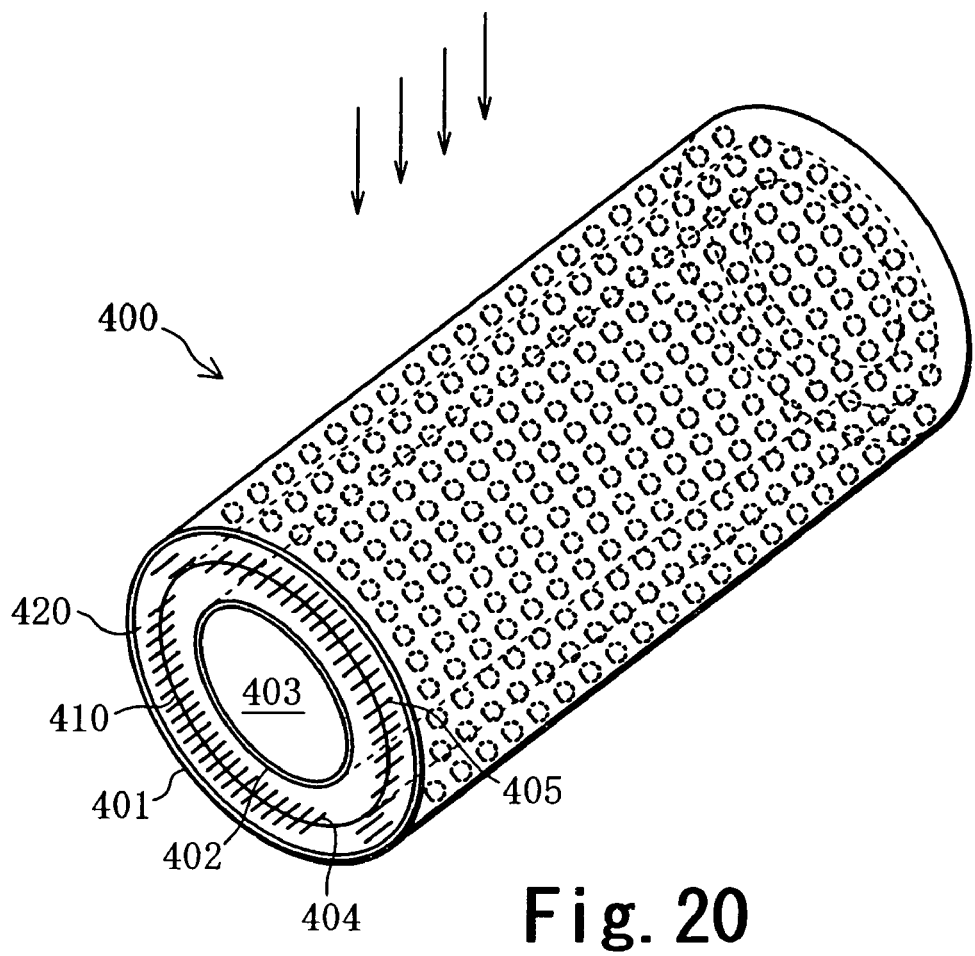
FIG. 20 is an oblique view of a laminated solar battery relating to other embodiment examples.
Figure 21:
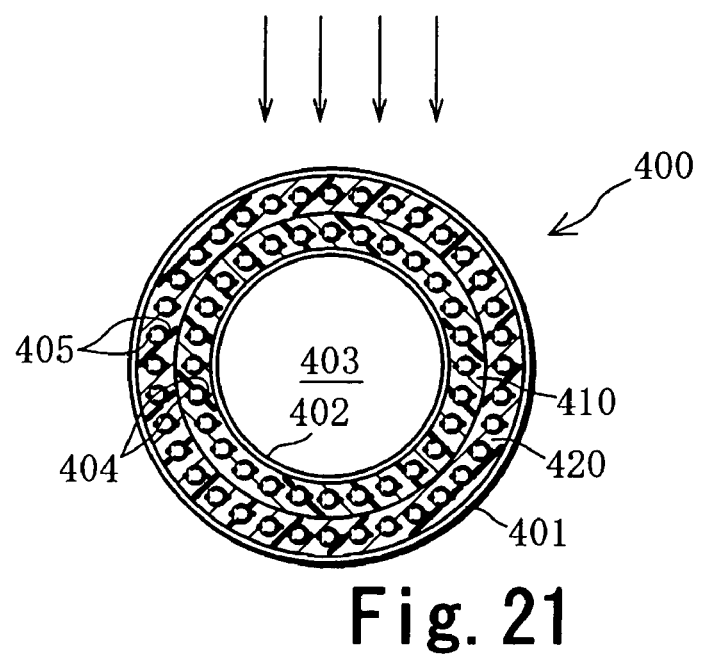
FIG. 21 is a sectional view of the solar battery of FIG. 20.

As shown in FIG. 20 and FIG. 21, laminated solar battery 400 has a structure in which two types of cylindrical solar cell modules 410 and 420 are densely laminated in the shape of concentric cylinders, a thin transparent cylinder 401 made of a transparent glass or a synthetic resin is mounted on the outermost layer, and a similar thin transparent cylinder 402 made of a transparent glass or a synthetic resin is mounted on the innermost layer.

A fluid passage 403 is formed at the center of laminated solar battery 400, the heat of which is transferred to a liquid or a gas flowing through fluid passage 403. The inner solar cell module 410 is a Ge cell group module in which multiple the Ge solar cells 20 are constructed in the shape of cylinders by forming them in plural columns and plural rows. The outer solar cell module 420 is a GaAlAs/GaAs cell group module in which multiple the GaAlAs/GaAs solar cells 40 are constructed in the shape of cylinders by forming them in plural columns and plural rows, as with the GaAlAs/GaAs cell group module 100.

In the modules 410 and 420, positive/negative electrode lead wires 404 and 405 protrude from both ends of modules 410 and 420 to the outside, but the solar cell arrays are desirably arranged so that a line of connecting positive/negative electrodes of solar cells 20 and 80 is faced to a direction perpendicular to the incidental direction of the sunlight.

In modules 410 and 420, multiple solar cells are connected in serial and parallel by means of positive/negative electrode lead wires 404 and 405, a serial/parallel connection circuit is constructed so as to equalize the output currents of solar cell modules 410 and 420, and the solar cell modules 410 and 420 are connected in series.

As the incidental sunlight comes from the outside, the Ge cell group module 410 having a long center wavelength of sensitivity wavelength band is arranged on the inner side, and the GaAlAs/GaAs cell group module 420 having a short center wavelength of sensitivity wavelength band is arranged on the outer side.

Although laminated solar battery 400 is a solar battery of two-layer structure laminating the cell group modules 410 and 420, it is equivalent to a solar battery of a four layer structure and both left and right sides of the solar battery 400 in FIG. 21 are equal to a solar battery of four or more layers to the incidental sunlight as arrows from the top, therefore the sunlight has a greater opportunity of reaching the solar cells, increasing photo-electric conversion efficiency.

Moreover, in laminated solar battery 400, the external shape is cylindrical, and has no directivity to the incidental direction of sunlight and it is easy to absorb the incidental sunlight from various directions. Furthermore, it can be cooled by a fluid passing within, increasing photo-electric conversion, with improved durability and inhibition of aging.

Still more, a laminated solar battery of two-layer structure was described in this embodiment, and laminated solar batteries of three-layer structure, four-layer structure, five-layer structure provided by laminating three or more types of cylindrical solar cell modules in the shape of concentric cylinders can also be realized.

Modification obtained by partly changing the above embodiments are described.

1] Two, three, five or more types of solar cell modules may be incorporated into a laminated solar battery, but it is desirable that at least one type of solar cell module be constructed by cell group modules having multiple solar cells and at least one type of solar cell module is constructed by a planar light receiving module. The shorter the center wavelength of the sensitivity wavelength band is, the more near the module is arranged to the incidental side of sunlight.

For example, one type of planar light receiving module and one type of cell group module is provided, wherein a planar light receiving module is arranged in the upper layer of the incidental side and a cell group module is arranged in the lower layer. In contrast, a cell group module is arranged in the upper layer and a planar light receiving module is arranged in the lower layer.

For example, one type of planar light receiving module and two types of cell group modules are provided, with a planar light receiving module being arranged in the upper layer on the incidental side, a cell group module being arranged in the medium layer, and a cell group module being arranged in the lower layer. In contrast, a cell group module is arranged in the upper layer on the incidental side, a cell group module is arranged in the medium layer, and a planar light receiving module is arranged in the lower layer.

For example, two types of planar light receiving modules and two types of cell group modules are provided, with two cell group modules being arranged in the medium layer, and the planar light receiving modules being arranged in the upper layer and the lower layer, respectively such that they are sandwiched from top to bottom.

2] The planar light receiving module (solar cell module) arranged in the top layer is constructed with a semiconductor which absorbs a UV ray of gallium nitride (GaN) single crystal or silicon carbide (SiC) single crystal, etc., in which case, a high-energy ultraviolet ray can be effectively utilized to generate electricity. Therefore not only the photo-electric conversion efficiency of the laminated solar battery can be enhanced, but also the aging of solar cell module in the lower part can be effectively inhibited due to ultraviolet rays.

3] The solar cells may also be manufactured with various semiconductors capable of photo-electric conversion such as amorphous semiconductors (e.g., Si, etc.), Group III-V compound semiconductors (e.g., InGaN, InGaP, etc.), II-VI compound semiconductors (e.g., ZnO, Cd—Te, etc.), chalcogenide compound semiconductors (e.g., $CuInGaSe_2$) including Group VI elements (S, Se, Te, etc.).

4] All of plural solar cell modules to be incorporated into a laminated solar battery are constructed by cell group modules, and it is desirable that a reflective film or a reflective member having a function of reflecting a light be provided in the lower part or downside of the solar cell module in the lowest layer.

5] A flexible transparent sheet is applied in place of hard materials, such as the transparent glass cover 76 and aluminum nitride substrate 201 and 301, etc. to create a flexible laminated solar battery.

6] A transparent insulating glass may also be adopted in place of the transparent synthetic resin 75*a* of the modules 70, 80, 90 and 100.

7] Scattering material (filler), such as a transparent glass with a higher refractive index, $TiO_2$, etc., is mixed into the light transmitting portion of modules 70, 80, 90 and 100 to enhance the optical performance of the light transmitting portion.

What is claimed is:

1. A laminated solar battery, comprising:
a plurality of solar cell modules each having a respectively different sensitivity wavelength band and each configured generally in a form of a layer, said solar cell modules being incorporated as an integrally laminated structure in which the solar cell modules are consecutively layered from an incident side to be exposed to sunlight in an order according to shortness of a center wavelength of the sensitivity wavelength band;
wherein said solar cell modules comprise a plurality of cell group modules of different types;
wherein each one of said cell group modules comprises a plurality of solar cell arrays aligned in a plurality of rows;
wherein each one of said solar cell arrays comprises a plurality of independent spherical solar cells and a pair of first leads;
wherein said plurality of cell group modules are buried integrally inside a common transparent synthetic resin material; and
wherein each one lead of said pair of first leads of each one of said solar cell arrays has an extended portion extending outside said synthetic resin material; wherein said solar cell modules together comprise at least one planar light receiving module having a planar pn junction, at least one positive electrode and at least one negative electrode, and at least one pair of second leads electrically connected respectively to said positive and negative electrodes.

2. The laminated solar battery according to claim 1, wherein:
   each said cell group module includes two layers of said nearly spherical solar cells aligned in columns and rows on respective planes running crosswise to the lamination direction, and
   said nearly spherical solar cells are arranged in said two layers so as not to overlap when viewed in the direction of lamination.

3. The laminated solar battery according to claim 1, further comprising a reflective member capable of reflecting the sunlight in a lower part or downside of said planar light receiving module, said at least one planar light receiving module being arranged in a lowest layer to be located downside of said cell group module.

4. The laminated solar battery according to claim 2, wherein any of said solar cell modules except for said one of said solar cell modules at the incident side of said laminated structure which is adapted to being exposed to sunlight is provided, on a surface thereof, with a mirror film that reflects a light of sensitivity wavelength bands which can be easily absorbed by ones of the solar cell modules above said any of said solar cell modules.

5. The laminated solar battery according to claim 2, further comprising a transparent member made of transparent glass or synthetic resin material which is fixed at a top of said solar cell module on said one of said solar cell modules at the incident side of said laminated structure which is adapted to being exposed to sunlight.

6. The laminated solar battery according to claim 1,
   wherein said planar light receiving module is arranged in a lowest position among said plurality of solar cell modules;
   wherein said plurality of solar cell modules comprise first to third cell group modules of differing type laminated sequentially from said incident side of sunlight;
   wherein said first cell group module includes first spherical solar cells each of which has a nearly spherical pn junction on a surface resin of a nearly spherical GaP single crystal;
   wherein said second cell group module includes second spherical solar cells each of which has a nearly spherical pn junction on a surface resin of a nearly spherical GaAs single crystal; and
   wherein said third cell group module includes third spherical solar cells each of which has a nearly spherical pn junction on a surface resin of nearly spherical Si single crystal.

7. The laminated solar battery according to claim 6, wherein said planar light receiving module includes a planar common pn junction formed in an InGaAs semiconductor layer which is formed on an n-type InP semiconductor substrate.

8. The laminated solar battery according to claim 1,
   wherein said planar light receiving module is arranged in a top layer of said plurality of solar cell modules;
   wherein said plurality of solar cell modules comprise first to third cell group modules of differing type laminated sequentially from said incidental incident side of sunlight;
   wherein said first cell group module includes first spherical solar cells each of which has a nearly spherical pn junction on a surface resin of a nearly spherical GaAs single crystal;
   wherein said second cell group module includes second spherical solar cells each of which has a nearly spherical pn junction on the surface resin of a nearly spherical Si single crystal; and
   wherein said third cell group module includes third spherical solar cells each of which has a nearly spherical pn junction on the surface resin of a nearly spherical Ge single crystal.

9. The laminated solar battery according to claim 8, wherein said planar light receiving module includes a planar common pn junction formed in a GaAsP semi-conductor layer which is formed on an n-type GaP semiconductor substrate.

10. The laminated solar battery according to claim 1, wherein:
    said different types of solar cell modules are each formed in a general shape of a cylinder, and
    said solar cell modules are laminated in a general shape of a concentric cylinder.

11. The laminated solar battery according to claim 1, wherein a portion of each one lead of said pair of first leads of each one solar cell array of said solar cell arrays is buried inside said common synthetic resin material, wherein said buried portion is in physical and electrical communication with each one of the plurality of spherical solar cells of said one solar cell array, and wherein said each one lead extends through said common synthetic resin material from a first extended portion outside the common synthetic resin material at one end of said one lead to a second extended portion outside the synthetic resin material at an opposite end of said one lead.

* * * * *